United States Patent [19]
Haneda

[11] Patent Number: 6,094,693
[45] Date of Patent: Jul. 25, 2000

[54] INFORMATION RECORDING APPARATUS USING ERASURE UNITS

[75] Inventor: Naoya Haneda, Kanagawa, Japan

[73] Assignee: Sony Corporation, Tokyo, Japan

[21] Appl. No.: 08/912,701

[22] Filed: Aug. 18, 1997

[30]     Foreign Application Priority Data

Aug. 29, 1996  [JP]  Japan .................................. 8-228966

[51] Int. Cl.⁷ .................................................. G06F 13/00
[52] U.S. Cl. ............................................. 710/36; 711/100
[58] Field of Search ................................... 395/856–881;
      369/48–97; 711/100–106; 710/5, 33–45;
      365/185

[56]            References Cited

U.S. PATENT DOCUMENTS

| | | | |
|---|---|---|---|
| 5,537,138 | 7/1996 | Yamada et al. | 346/76 |
| 5,579,502 | 11/1996 | Konishi et al. | 711/103 |
| 5,611,067 | 3/1997 | Okamoto et al. | 711/103 |
| 5,619,570 | 4/1997 | Tsutsui | 380/4 |
| 5,659,745 | 8/1997 | Inoue | 707/206 |
| 5,677,900 | 10/1997 | Nishida et al. | 369/48 |
| 5,717,953 | 2/1998 | Tsutsui et al. | 710/45 |
| 5,724,612 | 3/1998 | Haneda et al. | 710/33 |
| 5,745,912 | 4/1998 | Konishi et al. | 711/103 |
| 5,774,434 | 6/1998 | Arataki et al. | 369/47 |
| 5,778,142 | 7/1998 | Taira et al. | 386/97 |
| 5,790,484 | 8/1998 | Maeda et al. | 369/32 |
| 5,798,991 | 8/1998 | Haneda | 369/47 |
| 5,805,544 | 9/1998 | Haneda | 371/30 |
| 5,832,493 | 11/1998 | Marshall et al. | 707/101 |
| 5,862,083 | 1/1999 | Tobita et al. | 365/185.09 |
| 5,925,112 | 7/1999 | Haneda et al. | 710/33 |

*Primary Examiner*—Christopher B. Shin
*Attorney, Agent, or Firm*—Limbach & Limbach, LLP

[57]               ABSTRACT

The simplified high-speed memory control and simplified flexible memory management are provided for an information recording/reproducing device having a recording medium having an erasure unit larger than the writing unit. A recording medium 3 is such a recording medium having an erasure unit larger than a writing unit, such as a flash memory. When recording data of a file transferred via a transfer control section 5 on a recording medium 3, a recording medium controller 2 records data beginning from the leading position of the erasure unit. Moreover, only data of a given file is recorded in one erasure unit, so that data of another file is not allowed to co-exist in one erasure unit. When re-writing file data, pre-existing files can be erased in a lump without retreating to, for example, an external buffer, thus assuring facilitated memory management, such as readout of file data.

22 Claims, 16 Drawing Sheets

INFORMATION RECORDING APPARATUS USING ERASURE UNITS

BACKGROUND OF THE INVENTION

1. Field of the Invention

This invention relates to an information recording method and, more particularly, to an information recording apparatus, information recording/reproducing apparatus, information recording method and information reproducing method in which a recording medium used has an erasure unit larger than a writing unit.

2. Description of the Related Art

In the U.S. Pat. No. 5,619,570 and U.S. Ser. No. 08/338, 538, the present Assignee has proposed an device in which a variety of information items can be purveyed by transferring the information such as speech, pictures, letters or programs from an information purveying device (information transferring device) to a recording device or a recording/reproducing device.

FIG. 1 shows a perspective view of a conventional first information recording/reproducing device 200A proposed in the above publications. The information recording/reproducing device 200A includes a coupling terminal 201, a display 202, a function selection section 203 and a recording medium, not shown, in the inside of the device.

The information recording/reproducing device 200A records the information purveyed by an information purveying device, not shown, via coupling terminal 201. There is no limitation to the contents of the information purveyed by the information purveying device which may be text information, speech information, picture information or computer programs. There is also no limitation to the types of the recording medium. However, semiconductor memories, capable of high-speed copying and random accessing and exhibiting superior portability, may preferably be employed.

The information recording/reproducing device 200A displays the contents of the information recorded on the recording medium on the display 202. The function selection section 203 is made up of, for example, pushbutton switches. The user selects the information recorded on the recording medium using the function selection section 203 for reproducing the desired information.

If the information recorded on the recording medium is a computer program, information reproduction means executes the program. In such case, the user can enter the information during execution, if need be. If the information recorded on the recording medium is the textual or picture information, it is displayed on the display 202 constituted by, for example, a liquid crystal display device. If the information is the speech information, it is outputted to an earphone 204. The earphone 204 may also be replaced by a speaker, or an output terminal for playback signals may be provided on the information recording/reproducing device 200A for connection to an external display device or a speaker.

FIG. 2 shows a perspective view showing a second conventional information recording/reproducing device 200B proposed in the above publication. The information recording/reproducing device 200B, made up of an information recording device 210 and an information reproducing device 220, is such a device in which the function of recording the information and that of reproducing the recorded information of the first information recording/reproducing device 200A are separated from each other.

In the information recording/reproducing device 200B, the information recording device 210 is inserted into an inserting/ejecting port 221 of the information reproducing device 220, for reproducing the information recorded on the information recording device 210. For reproducing the information recorded on the information recording device 210 by the information reproducing device 220, it becomes necessary to transmit data and information items between the information recording device 210 and the information reproducing device 220. The information recording device 210 is configured so that a coupling terminal 212 is provided for coupling to the information reproducing device 220 and a coupling terminal, not shown, associated with the coupling terminal 212, is provided in the information reproducing device 220, with the two coupling terminals being coupled together on loading the information recording device 210 on the information reproducing device 220. Although the information recording device 210 includes two coupling terminals, namely the coupling terminal 211 for coupling to the information purveying device as later explained and the coupling terminal 212 for coupling to the information reproducing device 220, a sole terminal may be used in place of the two terminals for switching between the two devices.

The information recording device 210 may be constituted solely by a recording medium, whereby the information recording device is a portable information recording device smaller in size and lighter in weight. In such case, readout from the recording medium or writing in the recording medium is controlled on the side of the information reproducing device 220 or the information purveying device.

FIG. 3 shows a perspective view of a conventional first information purveying device 230 proposed in the above-referenced Publication. The information purveying device 230 includes a display 231 for displaying the contents or costs of the purveyed information, an output selection section 232 for selecting the information desired by the user and an insertion/ejection port 230 via which the user can insert the information purveying device 230 into the information recording/reproducing device for recording the information. The information purveying device 230 also includes a recording medium having stored therein the information purveyed to the device and an information copying controller for writing the information in the information recording/reproducing device.

The user connects the coupling terminal 201 of the information recording/reproducing device 200A shown in FIG. 1 to a coupling terminal, not shown, provided in the information purveying device 230. The user also inserts the information recording device 210 shown in FIG. 2 in the insertion/ejection port 233 of the information purveying device 230. The user selects the information desired to be purveyed by the output selection section 232 based on the contents and costs of the information displayed on the display 231. The information copying controller of the information purveying device 230 writes the information purveying the selected information in the information recording/reproducing device 200A or in the information recording device 210.

Meanwhile, the information purveying device 230 need not be provided with the recording medium having the purveyed information recorded thereon. Instead, the information purveying device 230 may be connected to an information purveying center over wired or wireless communication means so that the desired information will be purveyed to the user via this communication means. If the recording medium is provided in the information purveying device 230, it is possible to update the information stored in the recording medium by the communication means for purveying the latest information while suppressing the communication cost.

FIG. 4 shows a perspective view of a second information purveying device 240 as proposed in the above-referenced publication. The information purveying device 240 is a device for purveying the information to the information recording device 210 shown in FIG. 2 and is configured so that an insertion port 241 and an ejection port 242 of the information recording device 210 are spaced apart at a distance from each other. This information purveying device 240 includes movement means, not shown, for transporting the information recording device 210 inserted into the insertion port 241. After copying the information to be purveyed, the information purveying device 240 ejects the information recording device 210 inserted into the insertion port 241 at the ejection port 242. A person desirous to have the information H receives the copy of the information as he or she walks in a direction of arrow A. The information purveying device 240 can purvey the information promptly to plural persons.

The conventional writing method in case the information is written from the information purveying device to the information recording/reproducing device and the recording medium provided in the information recording/reproducing device is such a recording medium in which the data erasure range is larger than the writing range as in a flash memory is now explained.

In a recording medium in which an erasure operation needs to be carried out before executing the data writing operation, such as one used in the flash memory, the erasure unit, referred to herein as a block, is usually larger than the writing unit, referred to herein as a page. Therefore, if the recorded data is erased before proceeding to data writing, there are occasions wherein data to be erased and data not to be erased exist together in a block. In such case, the data contained in the block for erasure and that is not to be erased is transiently retreated to, for example, a buffer provided outside the recording medium, and again written after the end of the erasure of all data in the block. This lowers the writing efficiency. Moreover, with this method, an external buffer is needed for storing one-block data.

Referring to a memory map diagram of FIG. 5, a method for writing data recorded in the flash memory as a recording medium is explained. A recording medium 103 uses three units of C (Chip), B(Block) and P(page) as a method for displaying the physical addresses. It is noted that C, B and P denote the number c of a recording medium chip or memory chip, the number b of a bloc k as the smallest section of erasure and the number p of the page as the smallest writing unit. The physical address of the memory chip 103 is represented as CBP [c:b:p] in association with CBP. The page capacity is 512 bytes in association with a file allocation table (FAT) filing system.

As a method for identifying data recorded on the recording medium 103, two units of F (file) and S (sector) are used, where F is the number of a file and S is the number s of the sector constituting the file. The data identification method is represented by FS[f:s] in association with f and s. It is noted that FS shown in the recording medium 103 is the identification number associated with the actually recorded sector data and FS shown in the file manager 104 records the identification number itself.

The recording medium 103 is made up of a sole memory chip. This memory chip C[0] is made up of four blocks of from block B[0] to B[3].

All data recorded on the recording medium 103 are managed by a file management section 104 in which there are recorded the leading physical address CBP[c:b:p] and the last sector number FS[f:s] in each file. The file management section 104 records the file management information in the logical addresses M[0] to M[I0−1], where m denotes the maximum number of files that can be managed by the file management section 104.

Referring to FIG. 5, the contents recorded in the recording medium 103 managed by the file management section 104 are as follows: There are recorded in the recording medium 103 two records, the logical sequence of which is F[1], F[0]. The file F[1] is recorded with the capacity of 6 sectors from address CBP [0:0:3], while the file F[0] is recorded with the capacity of 3 sectors from address CBP [0:0:0], with the file F[0] and the file F[1] being recorded across three blocks. Since there is only one memory chip C[0] in the present instance, it is possible to omit C[0] as the file management information and the physical address.

It is assumed, for explanation sake, that the file F[0] of the recording medium 103, where the above-mentioned file F[0] and the file F[1] have been recorded, is rewritten. Since the data FS[1:0] of the file F[1] is contained in the block B[0], data FS[1:0] contained in the block B[0] and that is not to be erased is retreated to an external buffer. The block B[0] is then erased. A new file F[0] is then written, along with retreated data FS[1:0], in the block B[0].

Therefore, as an operation other than actual writing operation, retreating of required data, block erasure or rewriting of retreated data are required. These operations represent an overhead in the writing operation, thus lowering the writing efficiency.

Another method for preventing the lowering of the writing efficiency is background erasure. This background erasure is, writing a new file in an address of a previously erased separate area in place of erasing the old file for writing a new file in the same address. After the end of the writing of the new file, an old file is erased during the system idle time. This apparently realizes high-speed writing.

In this background erasure, it is assumed, for explanation sake, that the file F[1], recorded on the recording medium 103 along with the file F[0], as shown in FIG. 5, is rewritten to file F[2].

In rewriting the file F[1], the new file F[2] is written in the 6-sector area from address CBP[0:2:1] already erased. Simultaneously, the file management information in the file management section 104 is changed. Subsequently, during the time the writing or readout for the recording medium 103 is not going on, the block B[1] that constituted the old file F[1] is erased.

FIG. 6 is a memory map diagram showing the results of background erasing of the file F[1] of the recording medium 103 shown in FIG. 5 for rewriting to the file F[2]. It is only four sectors of data FS[1:1] to FS[1:4] making up a block that can be erased by background erasure. Thus, data FS[1:0] of file F[1] and data FS[1:5] are left without erasure in the block B[0] and in the block B[2], respectively.

Meanwhile, if there is no sufficient vacant apace in the recording medium 103 for recording a new file, it is difficult to write data at a high speed by background erasure.

In the recording medium 103 in the state shown in FIG. 7, there are recorded three files, the logical sequence of which is F[1], F[2] and F[0]. These files F[1], F[2] and F[0] are recorded with the capacity of 6 sectors from the address CBP [0:0:3], the capacity of 4 sectors from the address CBP[0:2:1] and with the capacity of 3 sectors from the address CBP [0:0:0], respectively, such that the file F[0], file F[1] and file F[2] exist across four blocks.

In the instance shown in FIG. 7, it is impossible to rewrite the file F[1] with 6 sectors by the above-mentioned background erasure. For such rewriting, the old file needs to be erased first of all. Since the file F[1] is recorded across the blocks B[0] to B[2], these blocks need to be erased first. However, another file F[0] and part of the file F[2] are also recorded in this area. Thus it becomes necessary to have the file F[0] and part of the file F[2] transiently retreated in, for example, an external buffer before erasure and to rewrite the file F[0] and part of the file F[2] in the recording medium after end of the erasure.

That is, since the data in the block under erasure is made up of necessary data, that is data that should not be erased, and unneeded data, that is data that can be erased, it is necessary to effect a data retreating operation with the aid of the external buffer.

Thus, as compared to a recording medium capable of data overwriting, significant overhead occurs at the time of writing, thus increasing the sum of write time.

This inconvenience is enhanced if the recording medium is constituted by plural memory chips and the files to be erased are recorded across plural memory chips. That is, in recording across plural memory chips, since recorded sector data making up a file are distributed in plural memory chips, it is necessary to check whether or not part of other files co-exists in all blocks making up a file. If the result is affirmative, it becomes necessary to perform the above-mentioned retreating operation and re-writing operation.

This situation occurs frequently if the musical numbers each of approximately three minutes are recorded on a recording medium capable of recording 10 minutes of music, and one of these three musical numbers is to be replaced by a new musical number, that is if the proportion of a file is large as compared to the capacity of the recording medium.

On the other hand, high-speed read-out performance is desirable for file read-out for coping with diversified application. However, since the power consumption is increased by the high-speed operation, an inconvenience is raised in connection with application for portable equipment.

SUMMARY OF THE INVENTION

It is therefore an object of the present invention to provide an information recording apparatus, information recording/reproducing apparatus and an information recording method in which simplified fast memory control and simplified flexible memory management may be enabled with the use of a recording medium having an erasure unit larger than the writing unit.

In one aspect, the present invention provides an information recording device including a recording medium having an information erasure unit larger than an information writing unit, file management means for managing the file management information for managing a file recorded on the recording medium and recording medium control means for writing data on the recording medium and erasing the written data based on the file management information. The recording medium control means writes a file from the leading position of the erasure unit of the recording medium and records the file management information corresponding to file writing in the file management means.

By writing the file beginning from the leading position of the erasure unit of a recording medium, only one file is recorded in the same erasure unit without being written in other unit(s).

In another aspect, the present invention provides an information recording device including a recording medium made up of a plurality of memory chips, in a sequenced form, each having an information erasure unit larger than an information writing unit, file management means for managing the file management information for managing a file recorded on the recording medium made up of the plural memory chips, and recording medium control means for writing data on the recording medium made up of the plural memory chips and erasing the written data based on the file management information. The recording medium control means writes a file from the leading end memory chip of the plural memory chips and records the file management information corresponding to file writing in the file management means.

By writing a file sequentially in parallel beginning from the leading one of plural memory chips, the file is recorded in regular order across plural memory chips beginning from the leading end memory chip. On the other hand, file management is executed on the logically leading end memory chip.

In still another aspect, the present invention provides an information recording/reproducing device including a recording medium having a plurality of sequenced memory chips each having an information erasure unit larger than an information writing unit, file management means for managing the file management information for managing a file recorded on the recording medium made up of the plural memory chips, recording medium control means for writing data on and reading out data from the memory chips and erasing the written data based on the file management information and setting means for setting high-speed readout for reading out the file in parallel from the plural memory chips by parallel accessing to the plural memory chips or low-speed low-power-consumption readout for individually accessing the memory chips for sequentially reading out the file. The recording medium control means reads out a file from the plural memory chips in parallel if high-speed readout is set by the setting means, while sequentially reading out a file from the plural memory chips if low-speed low power-consumption readout is set by the setting means.

The file is read in parallel from plural memory chips or, alternatively, a file is sequentially read out and reproduced from plural memory chips.

In still another aspect, the present invention provides an information recording method wherein, for recording file data on a recording medium having an information erasure unit larger than an information writing unit, the file data is written beginning from the leading position of the erasure unit.

By writing the file beginning from the leading position of the erasure unit of a recording medium, only one file is recorded in the same erasure unit without being written in other unit(s).

In still another aspect, the present invention provides an information recording method wherein, if, when recording file data on a recording medium having an information erasure unit larger than an information writing unit, the capacity of a file for recording is larger than the recording capacity that can be recorded in the erasure unit, the file for recording is split into plural portions and each split file portion is written beginning from the leading position of the erasure unit.

If recording data is larger than a capacity that can be recorded in the erasure unit, the recording data is split for recording. The split file is managed by file management means.

In still another aspect, the present invention provides an information recording method wherein a plurality of memory chips each having an information erasure unit larger than an information writing unit are sequenced to form a set of memory chips, and wherein data of a file for recording are split in terms of the writing units. The split file data is sequentially written in parallel on the plural memory chips with the splitting sequence being associated with the sequence of the memory chips.

By writing a file sequentially in parallel beginning from the leading one of plural memory chips, the file is recorded in regular order across plural memory chips beginning from the leading end memory chip. On the other hand, file management is executed on the logically leading end memory chip.

In yet another aspect, the present invention provides an information reproducing method wherein, when reading out a file from a recording medium made up of a plurality of memory chips, high-speed readout or low-power-consumption readout is set, and wherein, if the high-speed readout is set, the plural memory chips are accessed in parallel in order to read out the file in parallel, whereas, if low-power-consumption readout is set, the individual memory chips are individually accessed for sequentially reading out the file.

The file is read in parallel from plural memory chips or, alternatively, a file is sequentially read out and reproduced from plural memory chips.

With the information recording device according to the present invention, a file is written beginning from the leading end position of an erasure unit of a recording medium. Only one file is recorded in the same erasure unit without writing other file(s). This eliminates the risk of the other file(s) co-existing in the same erasure unit, so that these other file(s) need not be retreated for file erasure, thus enabling simplified high-speed file erasure.

Also, with the information recording device according to the present invention, a file is written sequentially in parallel beginning from the leading one of plural memory chips for recording in regular order across the memory chips beginning from the leading one of the plural memory chips. On the other hand, file management is on the logically leading end memory chip thus enabling flexible file management. This is particularly effective for file management exhibiting high amenability to sequential accessing.

With the information recording/reproducing device according to the present invention, a file can be read in parallel from plural memory chips, or can be sequentially read out and reproduced from the plural memory chips, thus enabling high-speed readout. In high-speed readout, power consumption is increased by running the plural memory chips in parallel. Therefore, if a low readout speed is tolerable, the file can be read sequentially from the memory chips for reducing power consumption.

With the information recording method according to the present invention, a file is written beginning from the leading end position of an erasure unit of a recording medium. Only one file is recorded in the same erasure unit without writing other file(s). This eliminates the risk of the other file(s) co-existing in the same erasure unit, so that these other file(s) need not be retreated for file erasure thus enabling simplified high-speed file erasure.

If, with information recording method according to the present invention, recording data is larger than the capacity that can be recorded in one erasure unit of a recording medium, the recording data is split for recording. The split file portions are managed by file management means. Thus, if the recording data is larger than the erasure unit, there is no risk of the other file(s) co-existing in the same erasure unit, so that these other file(s) need not be retreated for file erasure thus enabling simplified high-speed file erasure.

Also, with the information recording method according to the present invention, a file is recorded sequentially in parallel beginning from the leading end memory chip for recording in regular order across the memory chips beginning from the leading end memory chip. On the other hand, file management is on the leading end memory chip, thus enabling flexible file management. This is particularly effective for file management exhibiting high amenability to sequential accessing.

With the information reproducing method according to the present invention, one of two readout methods, namely high-speed readout for reading out the file in parallel from the plural memory chips by parallel accessing to the plural memory chips or low-speed low-power-consumption readout for individually accessing the memory chips for sequentially reading out the file, can be selectively used depending on the particular application. This renders it possible to use the high-speed readout having a large power consumption but a fast readout speed or the low-speed low-power-consumption readout having the low readout speed but low power consumption.

DESCRIPTION OF THE PREFERRED EMBODIMENTS

Figure 1:
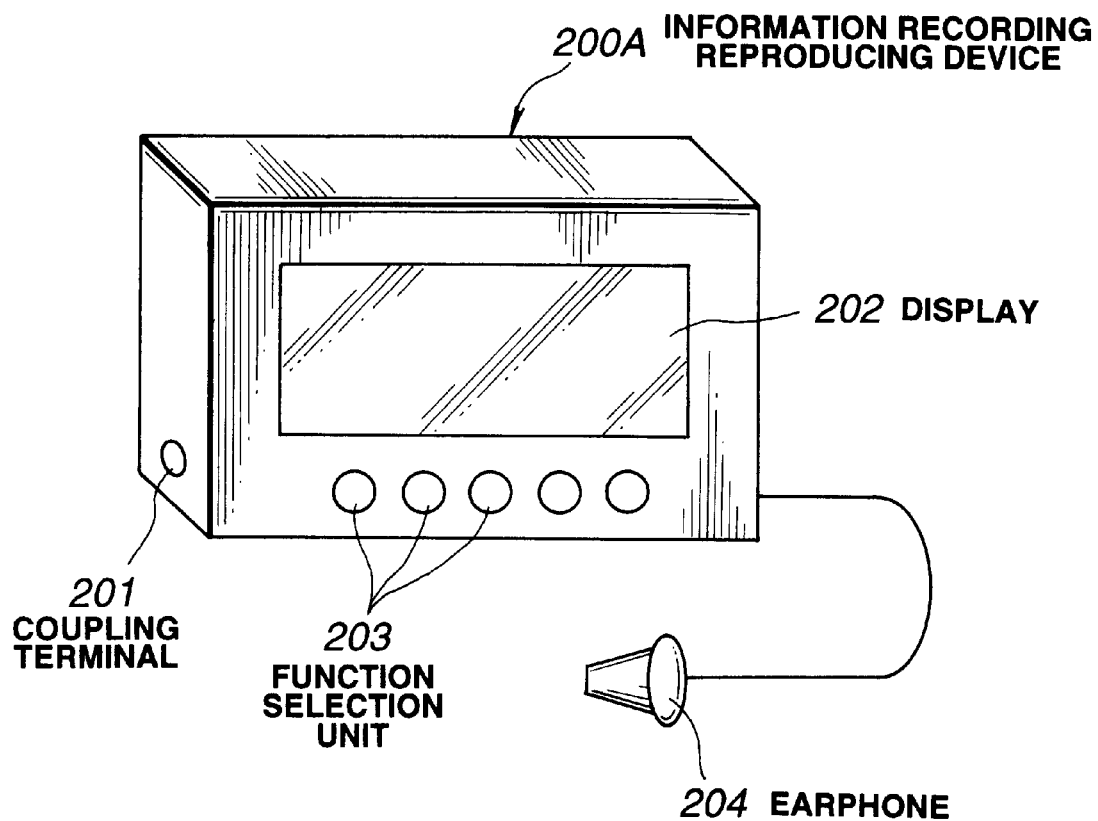
FIG. 1 is a perspective view of a conventional first information recording/reproducing device.
Figure 2:
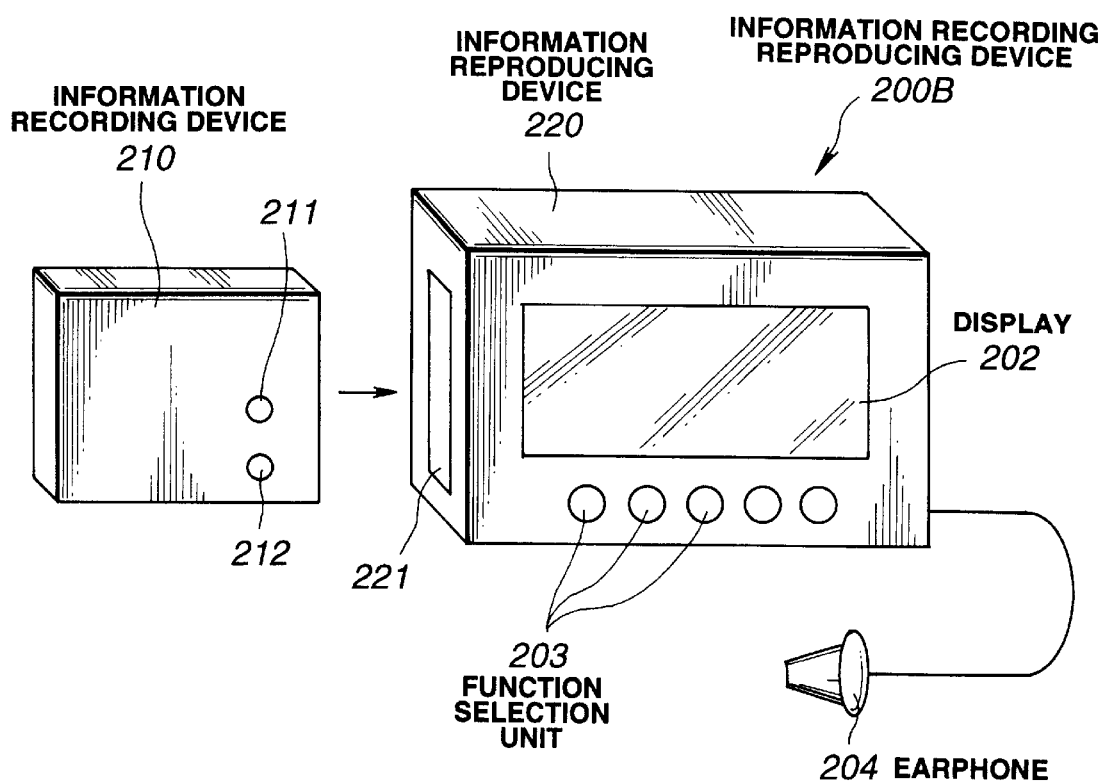
FIG. 2 is a perspective view of a conventional second information recording/reproducing device.
Figure 3:
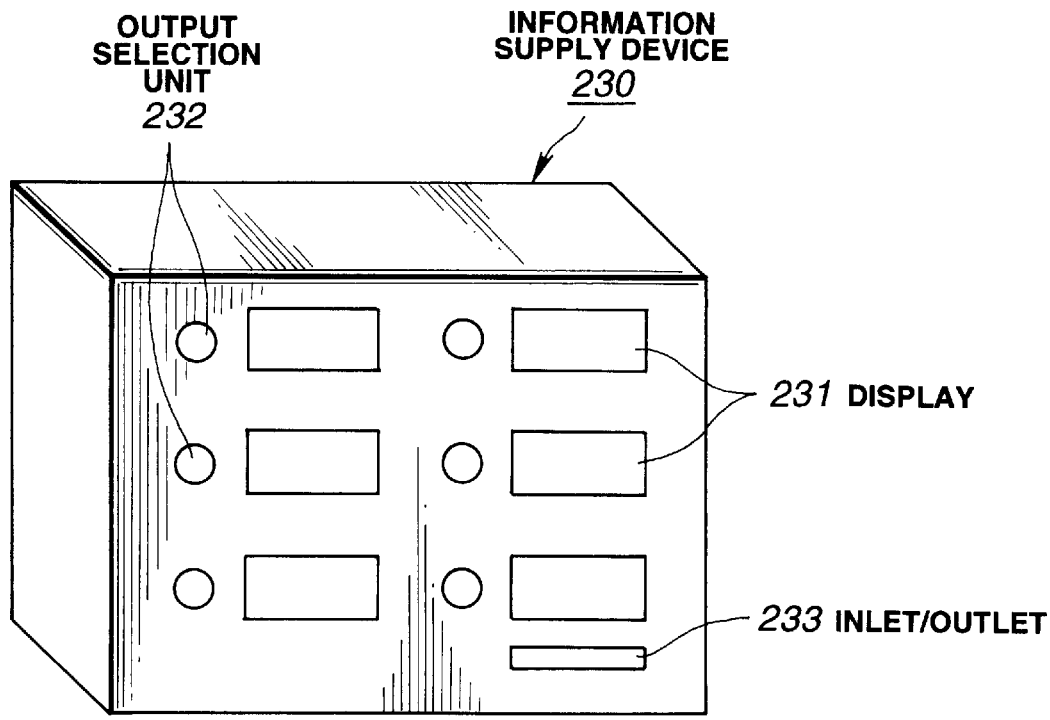
FIG. 3 is a perspective view showing a conventional second information purveying device.
Figure 4:
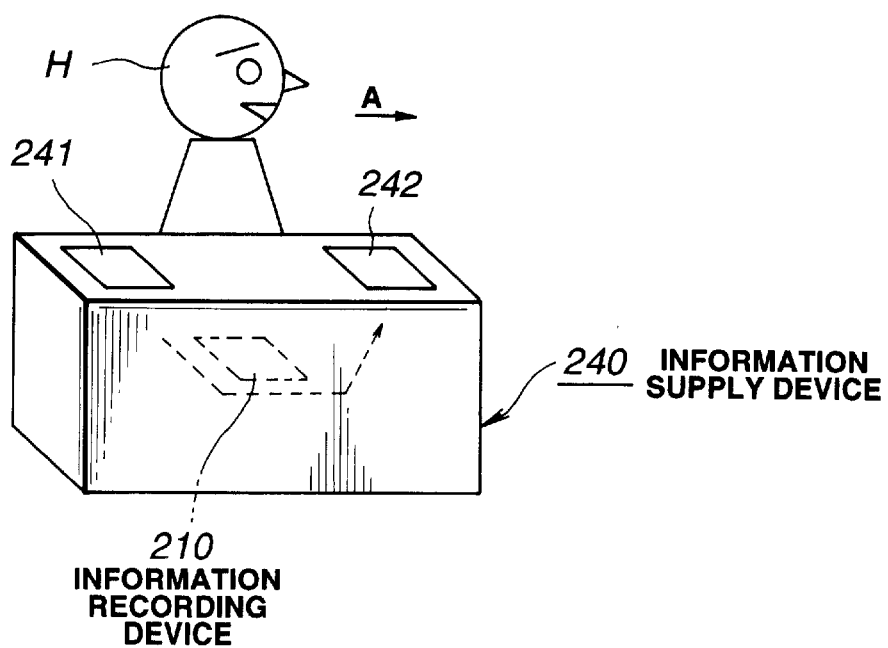
FIG. 4 is a perspective view showing a conventional second information transferring device.
Figure 5:
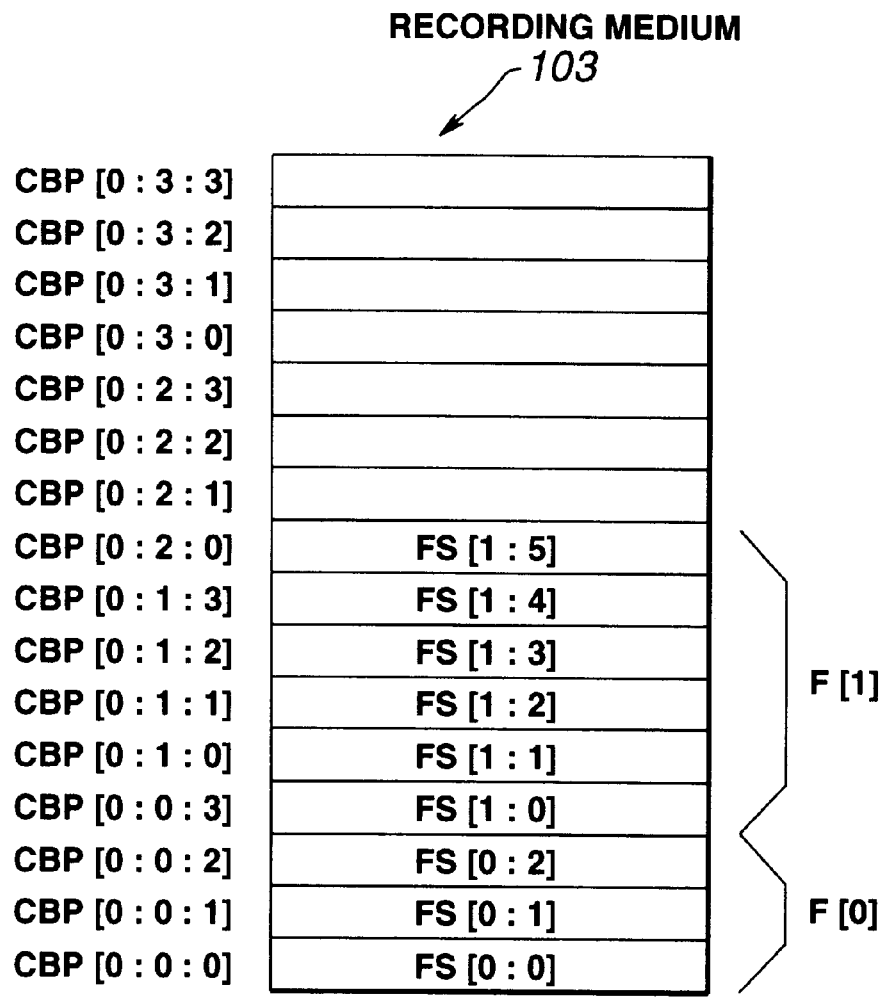
FIG. 5 is a memory map diagram of a recording medium in which a file has been written by a conventional information recording method.
Figure 5:
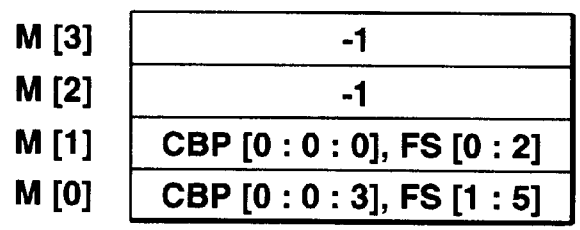
Figure 6:
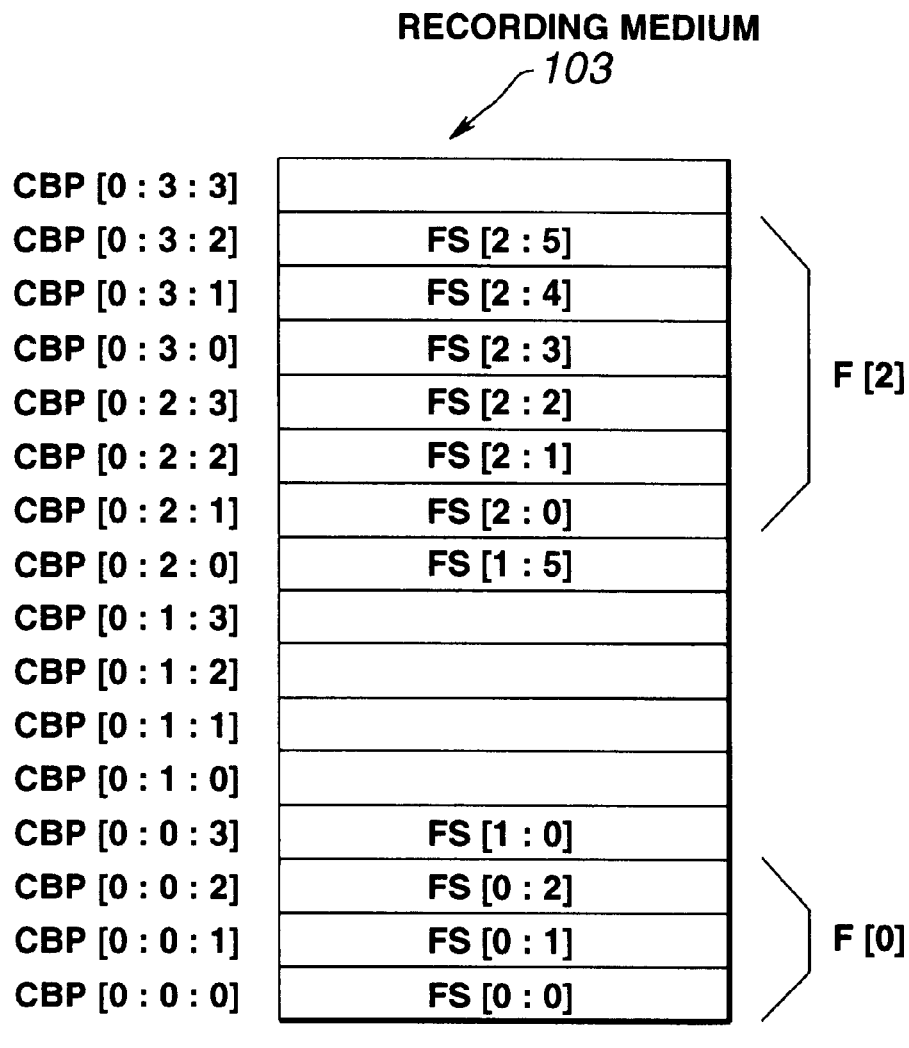
FIG. 6 is another memory map diagram of a recording medium in which a file has been written by a conventional information recording method.
Figure 6:
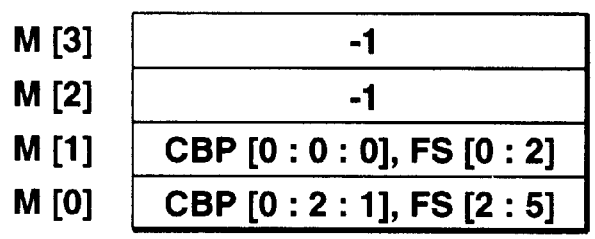
Figure 7:
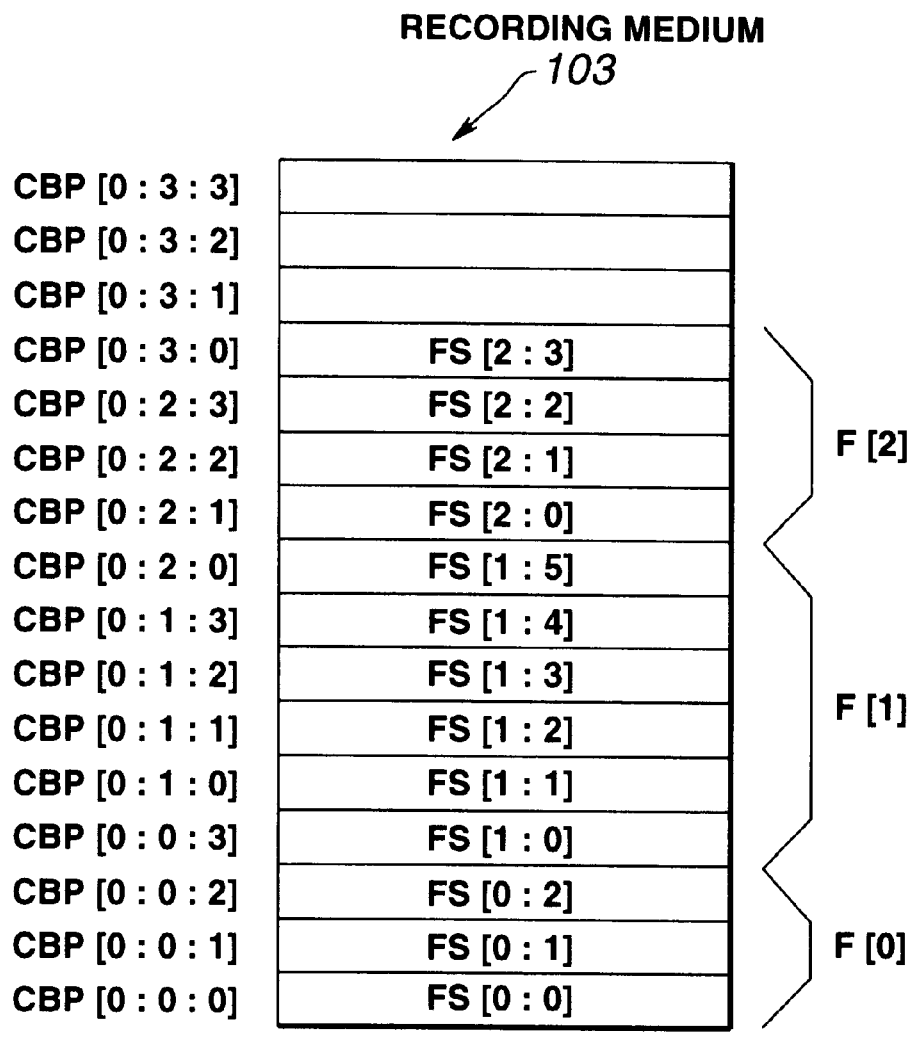
FIG. 7 is yet another memory map diagram of a recording medium in which a file has been written by a conventional information recording method.
Figure 7:
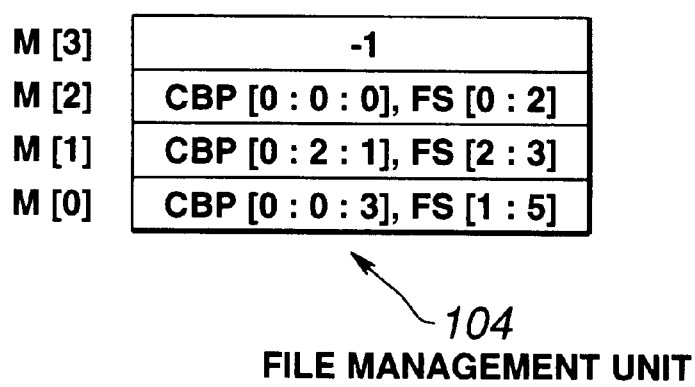

Referring to the drawings, preferred embodiments of the present invention will be explained in detail.

Figure 8:
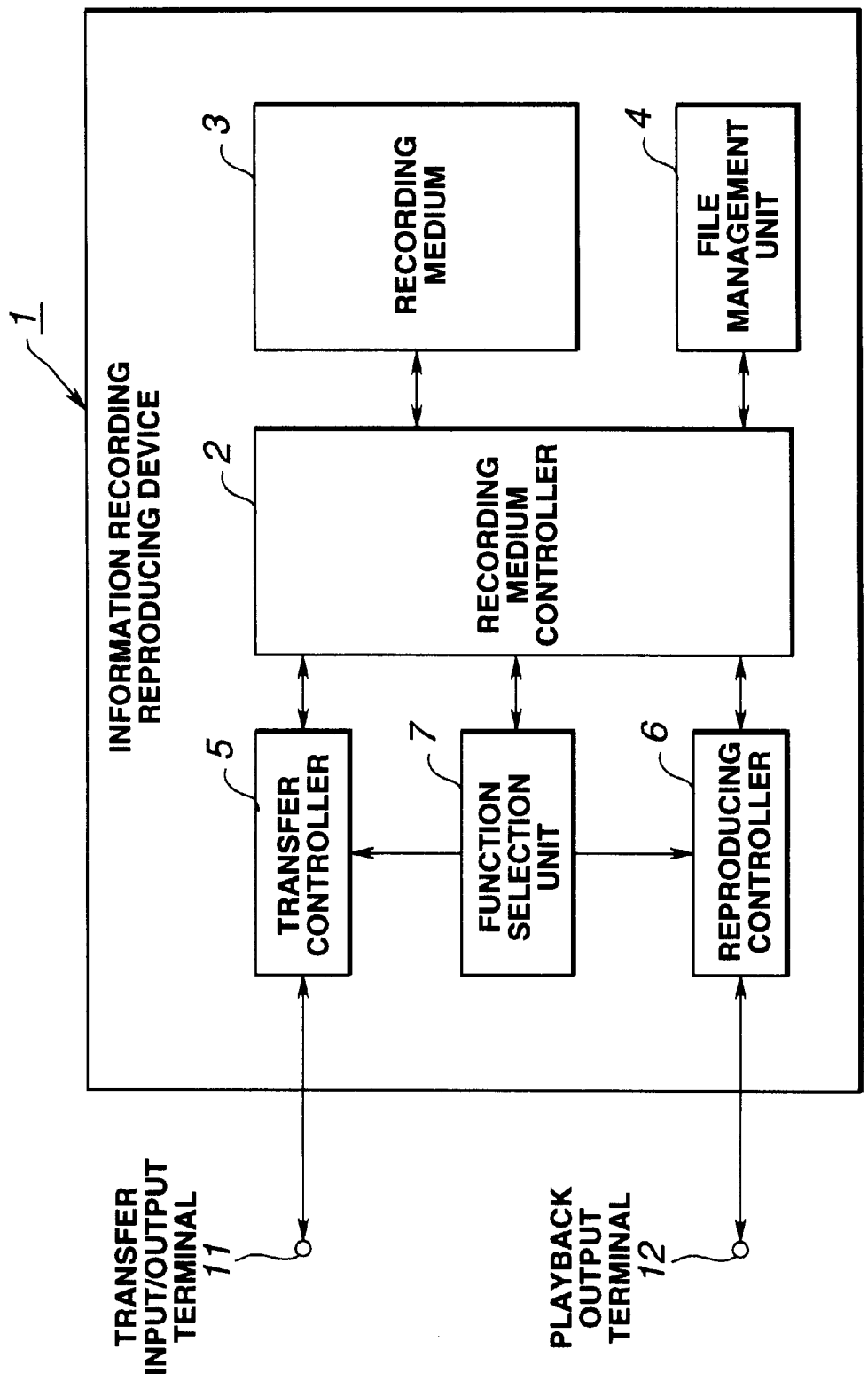
FIG. 8 is a block diagram showing an information recording/reproducing device according to the present invention.

FIG. 8 is a block diagram showing an information recording/reproducing device 1 according to the present invention. The information recording/reproducing device 1 is a device for recording the information purveyed from an information purveying device, not shown, such as the textual information, speech information, picture information or computer programs, reproducing the recorded information or transferring the recorded information.

The information recording/reproducing device 1 includes a function selection section 7 for selecting and entering desired functions, such as recording or reproduction, by the user of the device 1, and a recording medium 3 made up of one or more memory chips (pieces of recording medium). The information recording/reproducing device 1 also includes a file management section 4 for managing the file recorded on the recording medium 3, and a recording medium controller 2 for controlling the file readout and writing and erasure for the recording medium 3 using this file management section 4. The information recording/reproducing device 1 further includes a transfer controller 5 for controlling data input to the device 1 and data output from the device 1 via a transfer input/output terminal 11, and a reproduction controller 6 for reproducing a file recorded on the recording medium 3 for outputting to a playback output terminal 12.

The recording medium 3 provided in the information recording/reproducing device 1 of the present invention is in need of erasure of data already recorded before execution of the data writing operation, and has an erasure unit (block) larger than the writing section (page). By using a random access type semiconductor memory for the recording medium 3 or a disc medium, faster information transfer becomes possible. By employing a non-volatile memory, no power source for holding the information becomes necessary to render it possible to reduce the size of the information recording/reproducing device 1 further. In particular, in the present embodiment, it is assumed that, for convenience of explanation, the recording medium 3 is made up of one or more memory chips, each of which is constituted by a NAND type flash memory.

The information recording/reproducing device 1 will now be explained in connection with a data recording method, a data erasure method, a data transfer method and a data reproducing method.

Data recording for the information recording/reproducing device 1 is started by interconnecting an output terminal and a transfer input/output terminal of an information purveying device, not shown, and by setting data recording on the function selection section 7 by the user.

Data purveyed by the information purveying device is supplied via transfer input/output terminal 11 to the transfer controller 5, which then executes a lower order transfer protocol as later explained for taking in input data in order to send the input data to the recording medium controller 2. At this time, the recording medium controller 2 refers to the file management section 4 in order to comprehend the file recording state in the recording medium 3 and in order to record the corresponding file management information in the file management section 4

By the lower order transfer protocol are meant ANSI X3. 131-1-1986 standard termed SCSI (Small Computer System Interface), an IEEE 1394 standard and a PC-Card standard of the PCMCIA (Personal Computer memory Card International Association). By using these standardized interfaces, the information recording/reproducing device 1 can realize applications having improved possibility for future extension.

It is desirable for the upper order transfer protocol to have the ability of not impairing the data transfer capability of the lower order transfer protocol of the transfer controller 5. It is because the data transfer capability of the information recording/reproducing device 1 in its entirety is influenced by the data transfer capability of the lower order transfer protocol of the transfer controller 5 or by the recording medium control capability of the upper order transfer protocol of the recording medium controller 2, whichever is lower. Therefore, the upper order transfer protocol of the transfer controller 5 and the lower order transfer protocol of the recording medium controller 2, both of high efficiency, become indispensable. Thus, with the upper order transfer protocol of the information recording/reproducing device 1 according to the present invention, the recording medium controller 2 writes data in parallel on plural memory chips of the recording medium 3 for speedup of the file recording operation.

The sequence of the upper order transfer protocol in case of writing data on the plural memory chips of the recording medium 3 is as follows:

The recording medium controller 2 furnishes a chip selection signal and a command specifying a data entry operation to the data-recording memory chips in this order. The recording medium controller 2 furnishes an address to the memory chip for writing data and transfers a page (512 bytes) of data supplied from the transfer controller 5 to an internal register of the memory chip. After transfer of one-page data (512 bytes), the recording medium controller 2 furnishes a command specifying a writing operation to the memory chip.

When supplied with the command specifying a writing operation, the memory chip sequentially writes one-page data (512 bytes) transiently stored in the internal register of the memory chip in the memory cells based on the previously designated write addresses. A pre-set internal write time is required for writing the one-page data (512 bytes) transiently stored in the internal register in the memory cell in their entirety.

The recording medium controller 2 sequentially executes inputting of data commands and addresses required for the above-mentioned writing operation to another memory chip without awaiting the pre-set internal writing time required for the memory chip to write data of the internal register in the memory cell.

When finally the writing of all data making up a file comes to a close, the recording medium controller 2 updates the file management information recorded in the file management section 4.

The sequence of the upper order transfer protocol in writing data of the recording medium controller 2 is executed on the premises that address data for writing has been erased previously. However, if data has not been previously erased, the file erasure operation as now explained is executed before proceeding to writing.

The recording medium controller 2 supplies a chip selection signal to the memory chip from which data is to be erased, and then sends a first command for block erasure. The recording medium controller 2 then furnishes an address of a data-writing block to the memory chip from which data is erased, and finally furnishes a second command specifying block erasure. After lapse of a preset time, the erasure operation comes to a close.

It is noted that the recording medium controller 2 again can sequentially execute supply of an erasure command and addresses to another memory chip without awaiting the lapse of the pre-set time. In this case, parallel bock erasure becomes possible to speed up the erasure operation.

On the other hand, the data transfer operation for the information recording/reproducing device 1 is started by interconnecting an input terminal and a transfer input/output terminal 11 of another information recording/reproducing device and setting data transfer by the function selection section 7 by the user.

When the user actuates the function selection section 7 for entering the specified file name, the recording medium controller 2 refers to the file management section 4 to recognize the corresponding file to execute the upper order transfer protocol as later explained for reading out data making up the file recorded on the recording medium 3. The recording medium controller 2 then furnishes the data to the transfer controller 5, which then executes the lower order transfer protocol for outputting the above data from the transfer input/output terminal 11 to the other information recording/reproducing device, not shown.

For data transfer, it is desirable that the lower order transfer protocol executed by the recording medium controller 2 can control data readout from the recording medium 3 so as not to impair the data transfer capability of the lower order transfer protocol, as in the case of the data recording described above. Thus, the upper order transfer protocol during readout is also designed to read out data in parallel from plural memory chips as in the data recording described above.

The sequence of the upper order transfer protocol in case of reading out data from the plural memory chips of the recording medium 3 is as follows:

The recording medium controller 2 furnishes a chip selection signal and a command specifying a readout operation to the data-readout memory chips in this order. The recording medium controller 2 then furnishes a data readout address to the memory chip from which to read out data.

The memory chip supplied with the above command and the address reads out one-page data (512 byte data) from the memory cell of the designated readout address to the internal register of the memory chip and subsequently outputs the data stored in the internal register. It is noted that pre-set internal readout time is required in order to read out data from the cell to transfer the read-out data to the internal register.

After the end of the internal readout operation for the previously designated memory chip, the recording medium controller 2 fetches readout data stored in the internal register to transfer the read out data to the transfer controller 5 in order to read out one-page data (512 bytes).

The recording medium controller 2 sequentially executes the inputting of the required command and address similar to those for the readout operation as described above for another recording medium, without awaiting the pre-set internal readout time required for the memory chip to read out memory cell data to the internal register.

The data reproducing operation by the information recording/reproducing device 1 is started by interconnecting an output terminal device, not shown, to the playback output terminal 12, and by setting the data reproduction on the function selection section 7 by the user. The output terminal device may be an earphone or a speaker if output data is speech data, while it may be a monitor if the output data is picture data.

If the user actuates the function selection section 7 to enter the designated filename, the recording medium controller 2 refers to the file management section 4 to recognize the corresponding file to execute the upper order transfer protocol for reading out data making up the file recorded on the recording medium 3. The upper order transfer protocol executed by the recording medium controller 2 in the playback operation is similar to the upper order transfer protocol in the above-mentioned readout operation. The recording medium controller 2 then furnishes the above data to the playback controller 6, which then reproduces the data to transfer the reproduced data via playback output terminal 12 to an output terminal, not shown.

It is noted that the contents of the playback processing carried out by the playback controller 6 depends on the contents of data recorded on the recording medium 3. That is, if data recorded on the recording medium 3 has been encoded in some way or another, the playback controller 6 executes the corresponding decoding operation. For example, if the data recorded on the recording medium 3 are picture signals and encoded by an MPEG (Moving Picture Experts Group) algorithm, the playback controller 6 executes decoding by the MPEG algorithm.

If the output of the playback controller 6 is picture signals or speech signals, its output rate is prescribed to a constant value. Thus it suffices for the recording medium controller 2 to read out data from the recording medium 3 in keeping with the data playback rate of the playback controller 6. If the data recorded on the recording medium 3 are compressed data, a lower readout rate suffices, because the upper order transfer protocol executed during the playback operation need not be as high as that required during the above-mentioned writing or transfer operations.

Meanwhile, the information recording/reproducing device 1 can also be set on the function selection section 7 for directly reproducing transfer input data for producing playback data without recording transfer input data on the recording medium 3. If the device is set in this manner for direct playback, data entered from the transfer input/output terminal 11 to the transfer controller 5 is supplied via recording medium controller 2 to the playback controller 6 where it is reproduced and outputted at playback output terminal 12. This renders it possible to utilize the external general-purpose recording medium thus enabling flexible system configuration.

Referring to FIGS. 9 to 12, the method for writing a file on the recording medium 3 of the information recording/reproducing device 1 of the present invention is explained.

The fundamental rule for the recording medium 3 in which to write a file is as follows:

The recording medium 3 uses, as a method for displaying the physical address, three units of C(Chip), B(Block) and P(page). It is noted that C, B and P denote the number c of a memory chip, the number b of a block as the smallest unit of erasure and the number p of the page as the smallest writing unit. The physical address of the memory chip 103 is represented as CBP [c:b:p] in association with CBP. The page capacity is 512 bytes in association with a file allocation table (FAT) filing system.

As a method for identifying data recorded on the recording medium 103, two units of F (file) and S (sector) are used, where F is the number f of a file and S is the number s of the sector constituting the file. The data identification method is represented by FS[f:s] in association with f and s. It is noted that FS shown in the recording medium 103 is the identification number corresponding to actually recorded sector data, while FS shown in the file management section 4 is the recorded identification number per se.

The recording medium 3 is made up of a sole memory chip. This memory chip C[0] is made up of four blocks of from block B[0] to B[3], while each block is made up of pages P[0] to P[3].

All data recorded on the recording medium 3 are managed by the file management section 4 in which there are recorded the leading block B[c:b:p] and the last sector number FS[f:s] in each file. The file management section 4 records the file management information in the logical addresses M[0] to M[m−1], where m denotes the maximum number of files that can be managed by the file management section 4.

Figure 9:
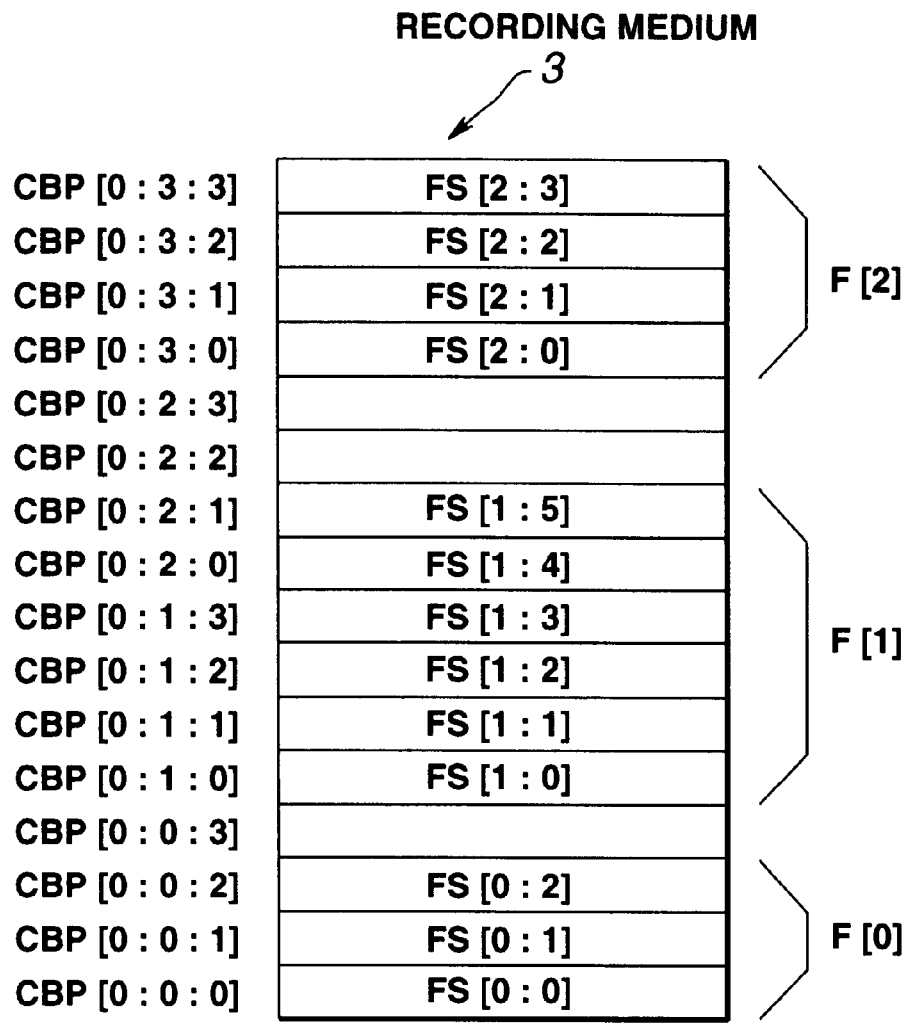
FIG. 9 is a memory map diagram of a recording medium in which a file has been written by an information recording method according to the present invention.

FIG. 9 is a memory map diagram for the recording medium 3 in which a file has been written by the information recording method according to the present invention. In the example of FIG. 9, the recording medium 3 is constituted by a sole memory chip.

The data recording method of the present invention records all files, inclusive of spilt files, beginning from the leading address of the block as a data erasure unit of the recording medium 3. Specifically, it can be seen from the file management information recorded in the file management section 4 that the following files have been recorded in the recording medium 3. That is, there are recorded in the recording medium 103 three files, the logical sequence of which is F[1], F[2], F[0]. The file F[1] is recorded with the capacity of 6 sectors from the leading address CBP [0:1:0], while the file F[2] is recorded with the capacity of 4 sectors from the leading address CBP [0:3:0] and the file F[0] is recorded with the capacity of 3 sectors from the leading address CBP [0:0:0].

The procedure for rewriting the file F[1] recorded on the recording medium 3 shown in FIG. 9 is as follows: Since there is no sufficient vacant area in the recording medium 3, a new file cannot directly be written in the vacant area by way of a file rewriting operation. Therefore, the old file recorded previously on the recording medium 3 needs to be erased. However, since data of the other file are not recorded in the same block in the recording medium 3 shown in FIG. 9, there is no necessity of retreating data of the other file, but the erasure of the file F[1] can be completed simply by erasing data of blocks B[1] and B[2].

Thus, if the recording medium 3 is made up of plural memory chips, it is only sufficient if file management is executed on the logical leading memory chip. This achieves simplified file management which is particularly effective for audio or picture data amenable to sequential accessing.

Figure 10:
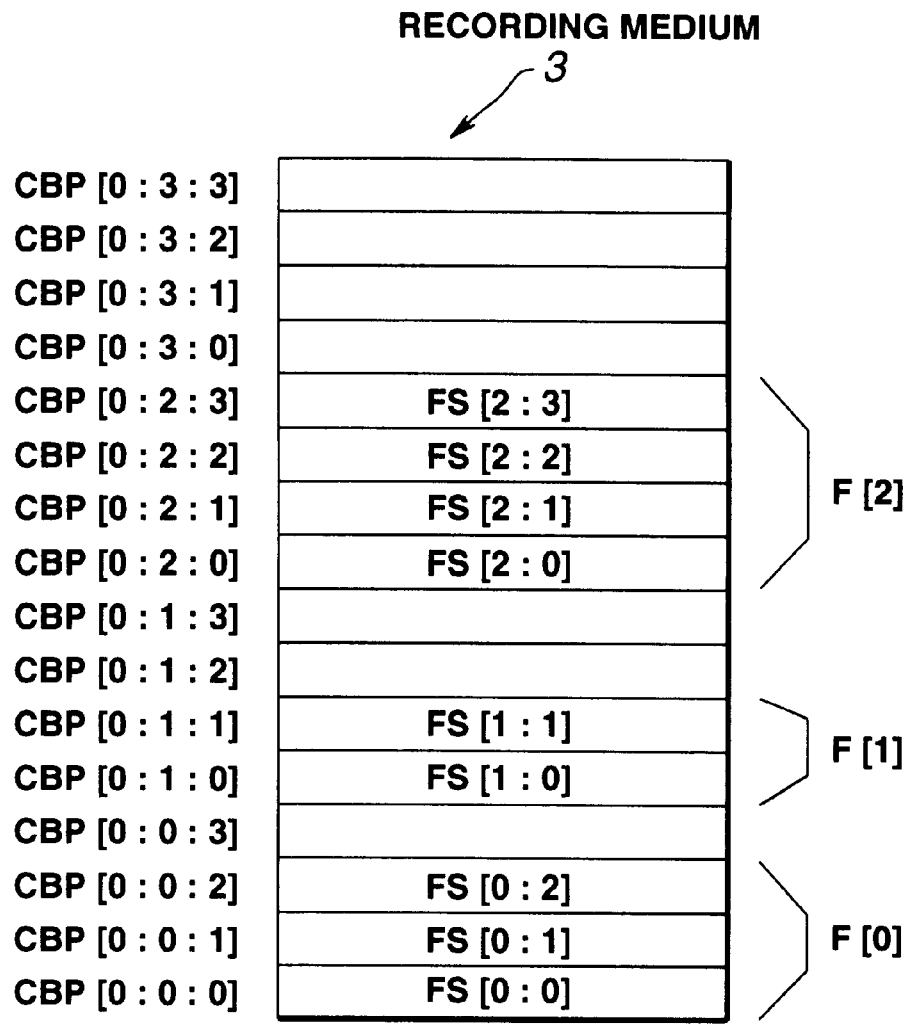
FIG. 10 is another memory map diagram of a recording medium in which a file has been written by an information recording method according to the present invention.
Figure 10:
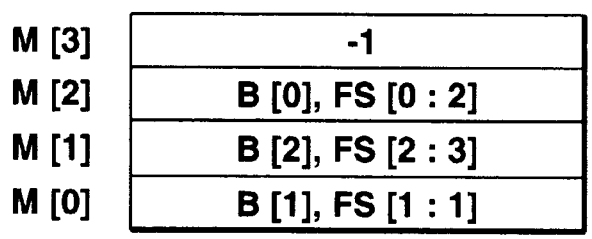

Referring to FIG. 10, the rewriting operation in case a newly recorded file is larger in capacity than the old file prior to rewriting is explained. In the embodiment of FIG. 10, the recording medium 3 is comprised of a sole memory chip.

On the recording medium 3, managed by the file management section 4, the following contents have been recorded, as shown in FIG. 10: That is, there are recorded in the recording medium 3 three files, the logical sequence of which is F[1], F[2], F[0]. The file F[1] is recorded with the capacity of 2 sectors from the leading address CBP [0:1:0], while the file F[2] is recorded with the capacity of 4 sectors from the leading address CBP [0:2:0] and the file F[0] is recorded with the capacity of 3 sectors from the leading address CBP [0:0:0].

For rewriting the file F[1] with the capacity of 2 sectors to a new file with the capacity of 6 sectors, the four sectors of the block B[1], in which is recorded the old file F[1], are insufficient. Moreover, another file F[2] is previously written in the block B[3] contiguous to the block B[1]. Therefore, this block B[3] cannot be used.

In such case, the recording medium controller 2 physically splits the new file for recording on the recording medium 3. Of course, the split files are recorded beginning from the leading address of the block as described above. The recording medium controller 2 records on the file management section 4 the file management information for providing logical continuation of the files recorded in the split form.

Figure 11:
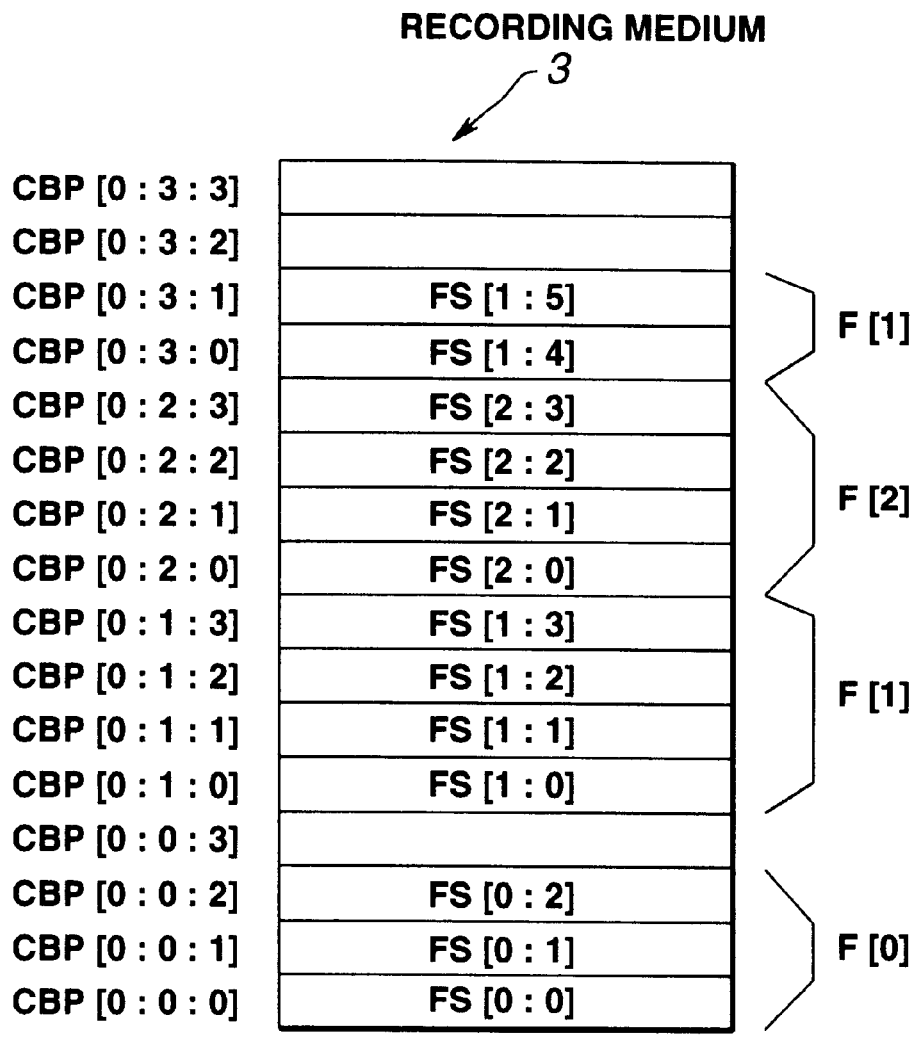
FIG. 11 is yet another memory map diagram of a recording medium in which a file has been written by an information recording method according to the present invention.
Figure 11:
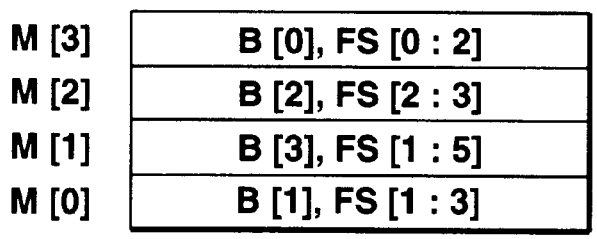

The result is that the new file F[1] is written in the split form in the blocks B[1] and B[3] of the recording medium 3, as shown in FIG. 11. The split files are made up of four sectors from the leading address CBP[0:1:0] of the block B[1] and two sectors from the leading address CBP[0:3:0] of the block B[3].

The file management section 4 records the file management information B[1], FS[1:3] and the file management information B[3], FS[1:5] in the logical addresses M[0] and M[1], respectively, while recording the file management information B[2], FS[2:3] and the file management information B[0], FS[0:2] in the logical addresses M[2] and M[3], respectively. The fact that FS[1:3] and FS[1:5] are present in the logical address M[0] and in the logical address M[1] next following the address M[0] indicates that the file F[1] recorded divided in two blocks are logically consecutive to each other, while also indicating that the logically consecutive sectors having the sector numbers 0 to 3 of the file F[1] have been recorded in the block B[1] and that the sectors having the sector number 4 and the last sector having the sector number 5 have been recorded in the block B[3]. Thus it can be recognized from the file management information recorded in the file management section 4 that the file recorded divided in the two blocks B[1] and B[3] are logically consecutive to each other.

Thus, with the data recording method for the recording medium 3 of the information recording/reproducing device 1 according to the present invention, plural files are not caused to co-exist in the same block for eliminating the necessity of simultaneously erasing the other file or retreating the necessary file (file that should not be erased) to a separate area. The result is that there is no necessity of providing a buffer for securing a vacant area or executing complex operations such that the overhead for the rewriting operation can be reduced significantly thus assuring high-speed rewriting.

Figure 12:
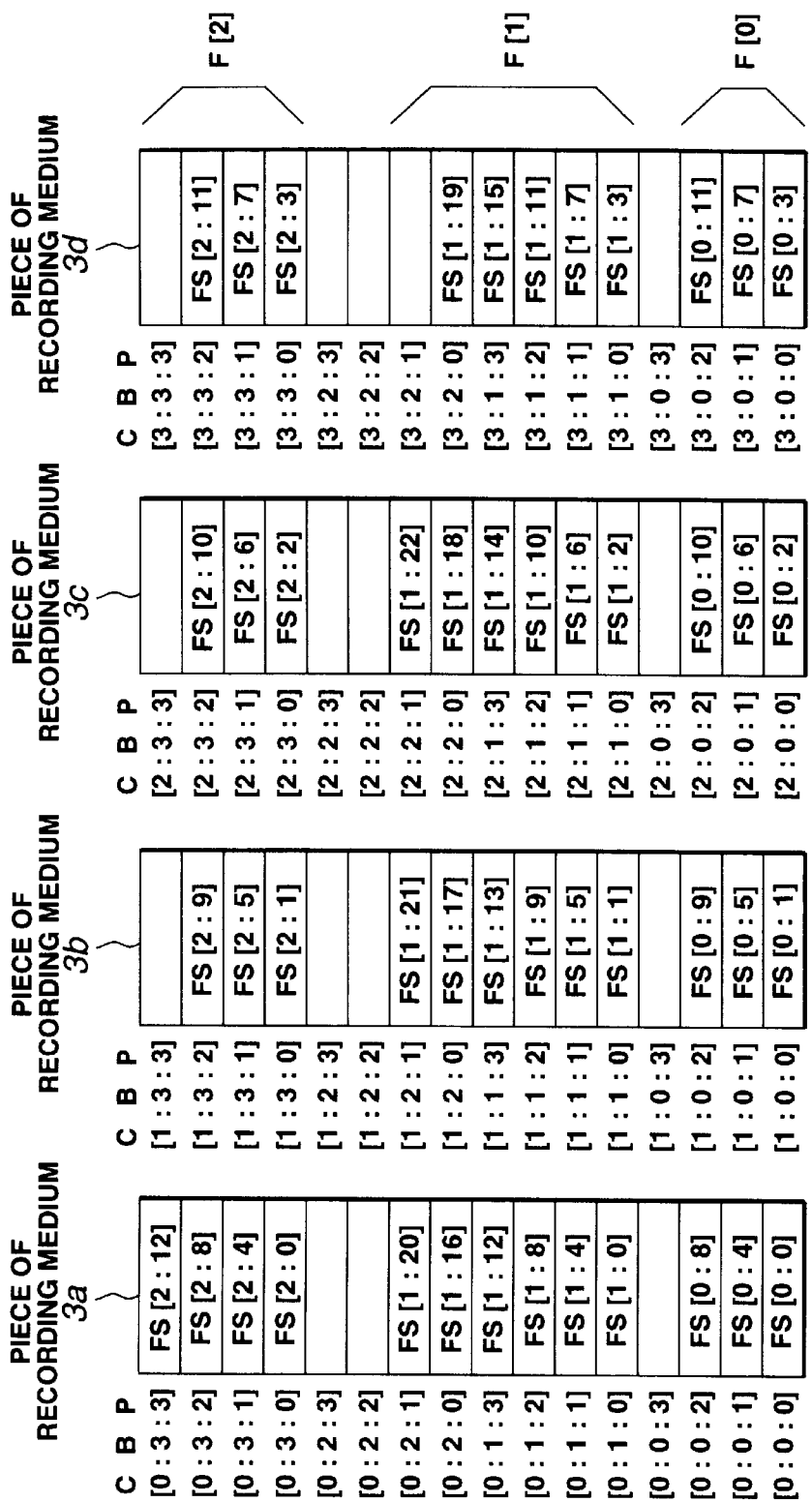
FIG. 12 is a memory map diagram of a recording medium made up of plural memory chips in which a file has been written by an information recording method according to the present invention.

FIG. 12 is a memory map diagram showing the case in which a recording medium 3 in which a file has been written by the information recording method of the present invention is made up of plural memory chips. The recording medium 3 shown in FIG. 12 is made up of four memory chips 3a, 3b, 3c and 3d. These plural memory chips 3a, 3b, 3c and 3d are sequenced previously. That is, these memory chips are sequenced beginning for the memory chip 3a, followed by the memory chips 3b, 3c and 3d in this order.

With the information recording method of the present invention, file sector data (data of a file split in writing units) are written in the order of the memory chip 3a, memory chip 3b, memory chip 3c and the memory chip 3d in parallel beginning from the leading address in the same block. Moreover, file management is done only for the logically leading memory chip 3a.

Referring specifically to FIG. 12, the file management information recorded in the file management section 4 specifies the following: There are recorded in the recording medium 3 made up of four memory chips 3a to 3d three files, the logical sequence of which is F[1], F[2], F[0]. The file F[1] is recorded with the capacity of 23 sectors from the leading address CBP [0:1:0] of the block B1, while the file F[2] is recorded with the capacity of 13 sectors from the leading address CBP [0:3:0] of the block B[3] and the file F[0] is recorded with the capacity of 12 sectors from the leading address CBP [0:0:0] of the block B[0].

The file F[1] of the recording medium 3 shown in FIG. 12 is rewritten as follows: This file F[1] is made up of four memory chips 3a to 3d over 8 blocks. In erasing the file F[1], the recording medium controller 2 executes parallel block erasure in the order of CB[0,1], CB[1,1], CB[2,1], CB[3,1], CB[0,2], CB[1,2], CB[2,2], CB[3,2]. Meanwhile, pre-set erasure time is consumed for erasing data recorded in the respective memory chips.

On completion of the erasure operation of the file F[1], the recording medium controller 2 starts writing of a new file. The writing operation can be started even if a memory chip other than a memory chip in which to make first writing within the erasure time in the erasure operation. In the embodiment of FIG. 12, sector data up to FS[1:22] are written across the memory chips 3a to 3d in the sequence of FS[1:0], FS[1:1], FS[1:2], FS[1:3], FS[1:4] and so forth.

If the recording medium 3 is made up of plural memory chips, the readout operation may be executed by a parallel operation as in the writing method described above. The sector data readout sequence is identical with the writing sequence. When reading out the file F[1], the recording medium controller 2 recognizes, based on the file management information recorded in the file management section 4, that the file F[1] has the capacity of 23 sectors beginning from the leading address CBP[0,1,0] of the block B[1]. For reading out the file F[1], the recording medium controller 2 reads out from the four memory chips 3a to 3d sector data up to FS[1:22] in the sequence of FS[1:0], FS[1:1], FS[1:2], FS[1:3], FS[1:4] and so forth.

For reading out data by a parallel operation, it may be selectively set by the user, or automatically depending on the contents of read-out data.

Thus, with the data recording method according to the present invention, since the blocks making up a file also exist across plural memory chips, the erasure and writing operations can be executed in parallel, thus enabling high-speed rewriting operations. Moreover, since the file management section 4 is not dependent on the number of memory chips, changes in the capacity of the recording medium 3 can be flexibly coped with.

By referring to a flowchart, the data writing method, data erasure method and the data readout method by the recording medium controller 2 provided in the information recording/reproducing device 1 of the present invention will be explained.

Figure 13:
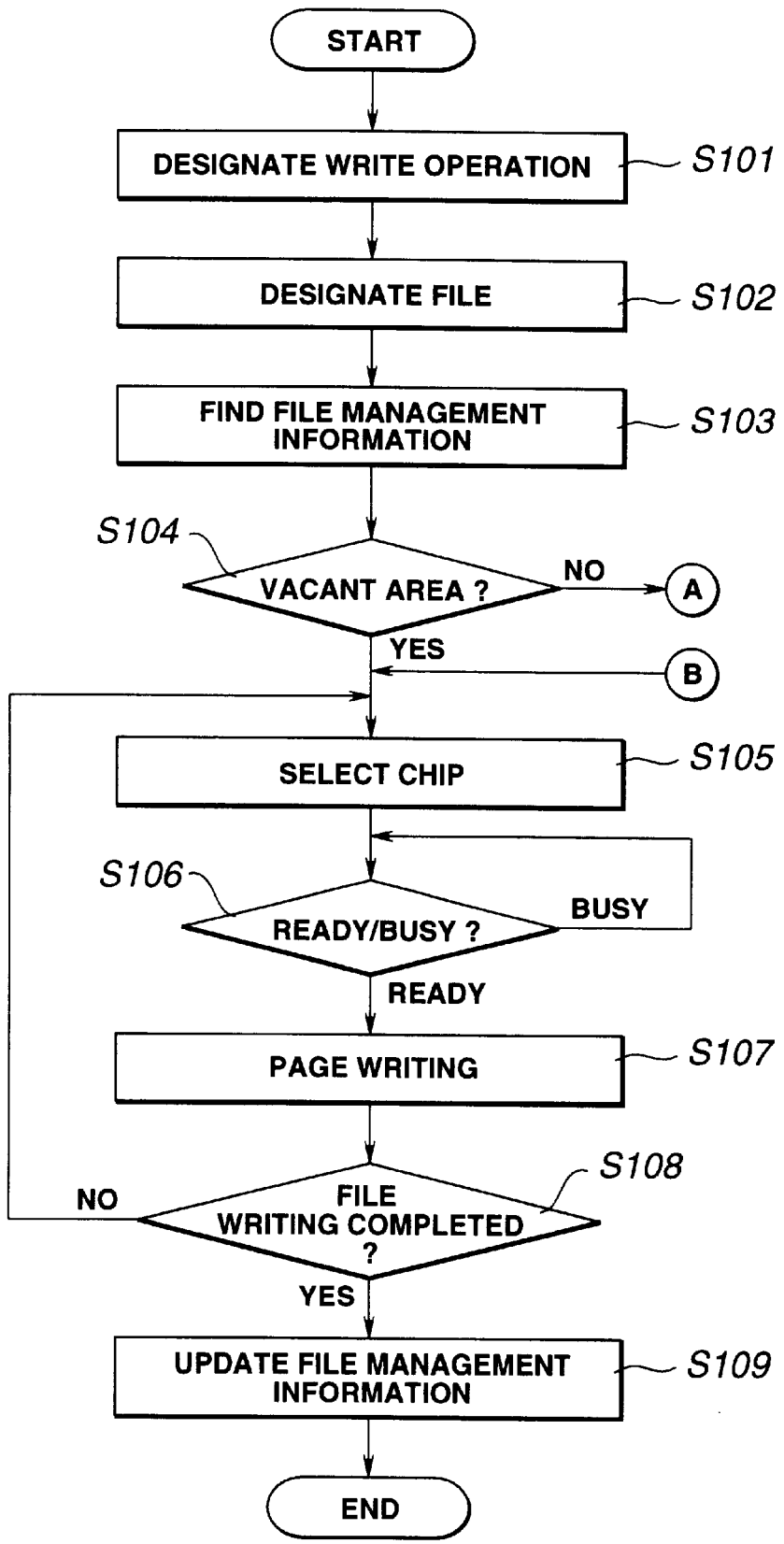
FIG. 13 is a flowchart showing the method of writing data for a recording medium controller provided in an information recording/reproducing device according to the present invention.

FIG. 13 shows a flowchart showing the data writing method by the recording medium controller 2 provided in the information recording/reproducing device 1 of the present invention.

First, at step S101, the recording medium controller 2 recognizes that an operating command requesting writing data transmitted from the transfer controller 5 on the recording medium 3 has been entered from the function selection section 7. At the next step S102, the recording medium controller 2 recognizes the information concerning the file for writing, such as a file name or a capacity, which the user has entered via the function selection section 7.

At the next step S103, the recording medium controller 2 finds a vacant area in the recording medium 3, based on the file management information recorded in the file management section 4. If the recording medium controller 2 judges at step S104 that there is a vacant area (YES), it starts writing of the file in the recording medium 3 as from the next step S105. If recording medium controller 2 finds at step S104 that there is no vacant area (NO), it the executes the block erasure as from the step S204 beginning at A in FIG. 14 for securing a vacant area.

Such judgment as to the possible presence of the vacant area at step S104 is facilitated because the total file capacity can be calculated based on the file management information recorded in the file management section 4. The file erased for securing the vacant area may be the automatically selected temporally or logically oldest file or a file selectively designated by the user using the function selection section 7.

Then, at step S105, the recording medium controller 2 furnishes a chip selection signal to the writing memory chip. For writing a sector at the leading end of a file, the logically leading end memory chip is selected at all times, as described above. Otherwise, the memory chips are selected in the regular sequence. At the next step S106, the recording medium controller 2 checks the ready-busy state as the status information of the memory chip selected in the preceding step S105 and then awaits at step S106 until the ready state (Ready) is reached. The memory chip selected first since start of the file writing operation is usually in the ready state. However, if processing is branched at step S104 to the erasure operation (NO), the memory chip is occasionally not in the ready state (Busy) because it is in the course of erasure.

If, at step S106, the recording medium controller 2 finds that the memory chip is in the ready state (Ready), it executes sector data writing in the writing sequence explained previously in detail. In this case, writing needs to be started at the leading address of the block. The same applies for split files. Of course, during writing from the internal register of the memory chip to the memory cell, the controller 2 can proceed to the next step without waiting for the end of the writing operation.

At the next step, the recording medium controller 2 checks whether or not writing in all sectors making up the file has come to a close. If the writing has not come to a close (NO), similar processing is repeated as from the step S105 for the other memory chip. If the recording medium controller 2 finds that the file writing has come to a close (YES), it updates and records the management information of the written file in the file management section 4 to terminate the file transfer inputting operation.

Figure 14:
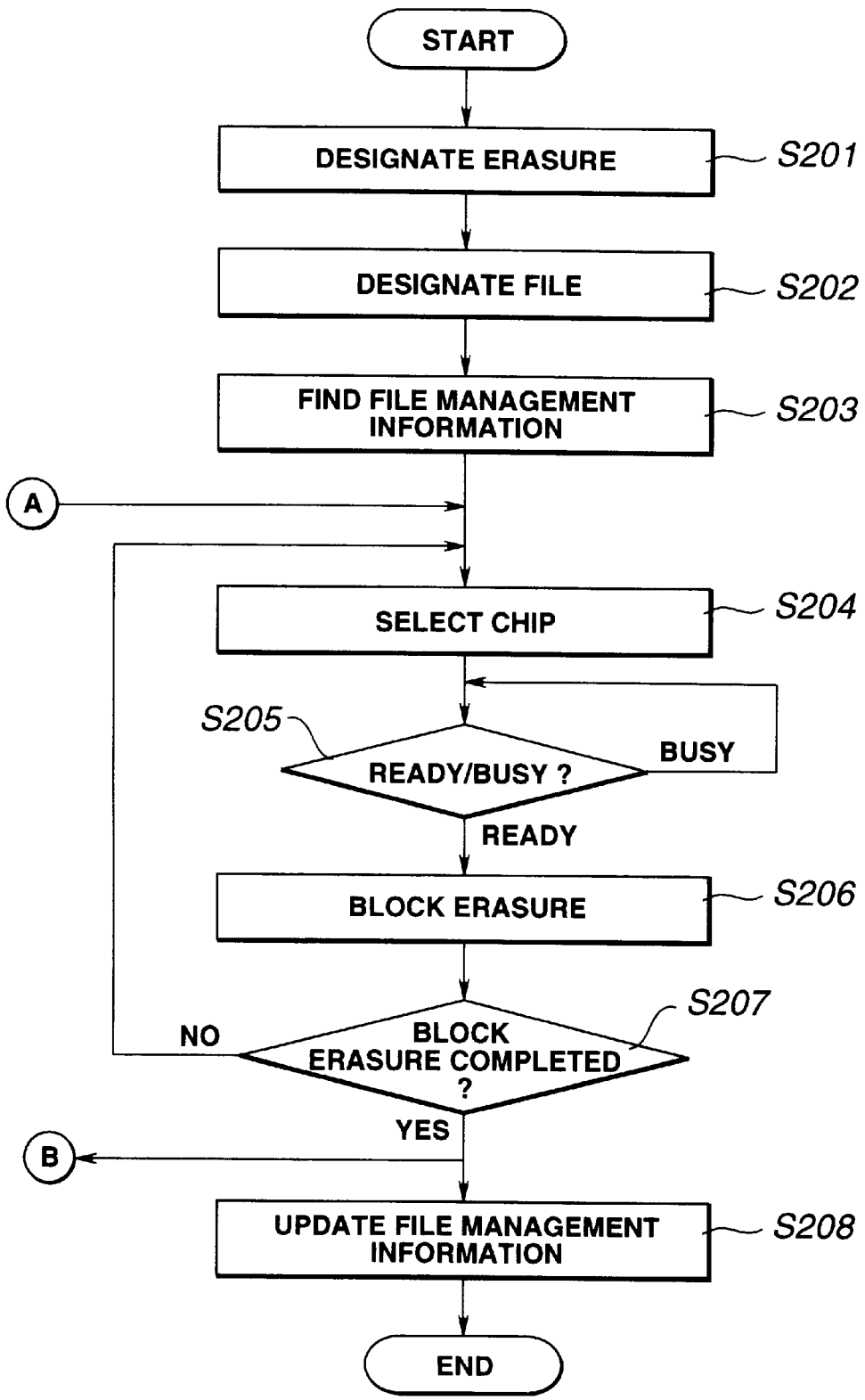
FIG. 14 is a flowchart showing the method of erasing data for a recording medium controller provided in an information recording/reproducing device according to the present invention.

FIG. 14 shows a flowchart for illustrating the data erasure method by the recording medium controller 2 provided in the information recording/reproducing device according to the present invention.

First, at step S201, the recording medium controller 2 recognizes that the user has entered a command requesting an erasure operation for the recording medium 3 at the function selection section 7. At the next step S202, the recording medium controller 2 recognizes the information concerning the file for erasure entered by the user at the function selection section 7, such as filename.

At the next step S203, the recording medium controller 2 finds the designated file based on the file management information recorded in the file management section 4.

Then, at step S204, the recording medium controller 2 furnishes a chip selection signal to a memory chip in which to execute block erasure. Since the block containing a sector corresponding to the leading end of a file is necessarily recorded at the logically leading end memory chip, the logically leading memory chip is selected at the initial stage of the erasure operation, while memory chips for block erasure are subsequently selected in the regular sequence. If, at step S104 in the writing operation shown in FIG. 13, it is found that there is no vacant area for writing the file (NO), the recording medium controller 2 proceeds to step S204 to execute the erasure.

At the next step S205, the recording medium controller 2 checks the ready/busy state as the status information of the memory chip selected at step S204 and is at a standby state at this step S204 until the ready state is reached. It should be noted that the memory chip selected for the first time since the start of file erasure is usually in the ready state.

If, at step S205, the recording medium controller 2 finds that the memory chip is in the ready state, it executes block erasure at the next step S206 in the block erasure sequence explained previously in detail. Of course, during block erasure, the controller 2 can proceed to the next step without waiting for the end of the erasure operation.

At the next step S207, the recording medium controller 2 checks whether or not erasure of all sectors making up the file has come to a close. If the writing has not come to a close (NO), similar processing is repeated as from the step S204 for the other memory chip.

If it is found that file erasure has come to a close (YES), the recording medium controller 2 deletes the management information of the erased file from the file management section 4 to terminate the file erasure operation. However, if the processing branches to step S204 in the course of the above-mentioned writing operation, the controller reverts to step S105 in the writing operation of B shown in FIG. 13, without executing the processing at step S208.

Figure 15:
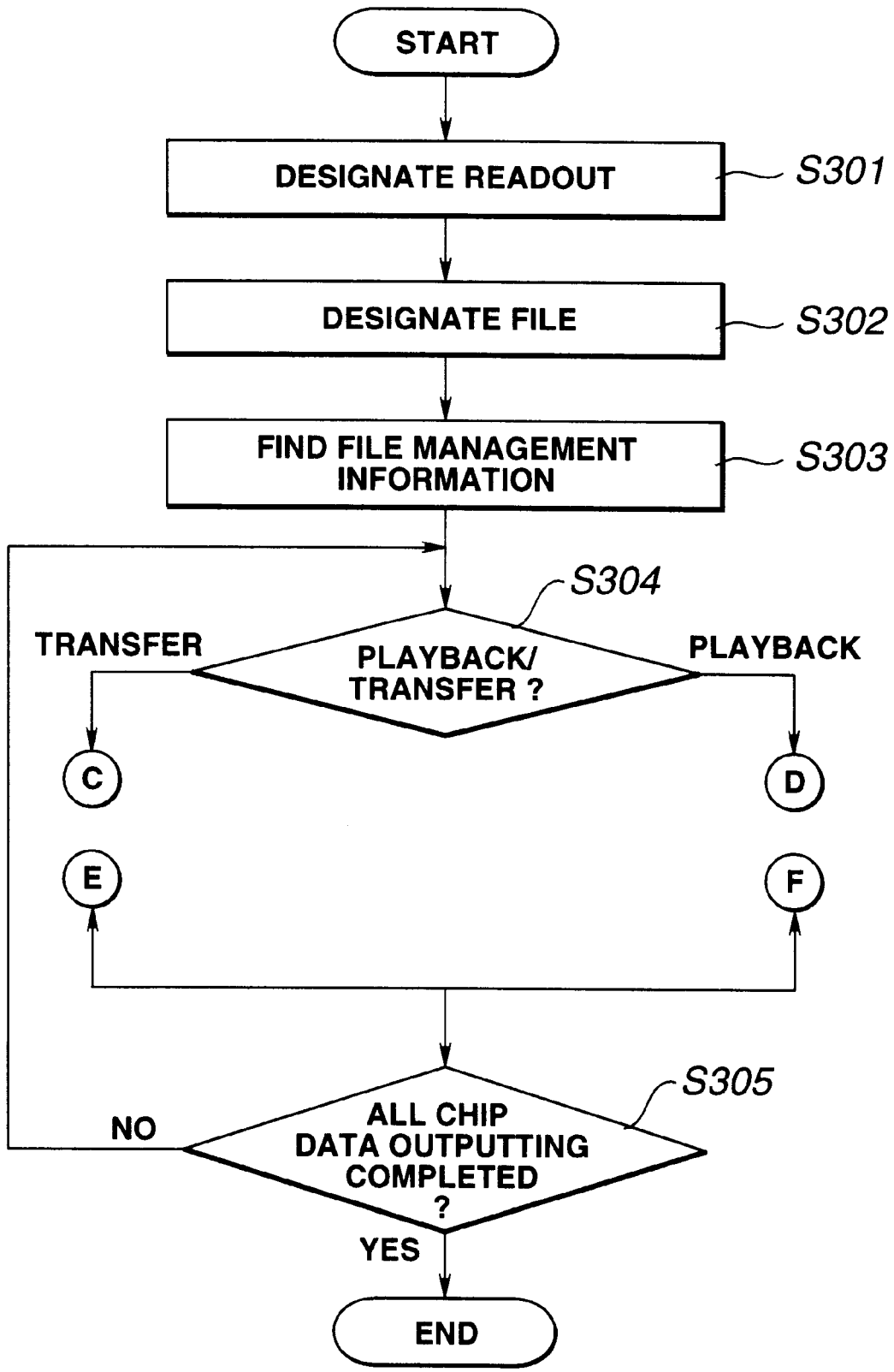
FIG. 15 is a flowchart showing the method of reading data for a recording medium controller provided in an information recording/reproducing device according to the present invention.
Figure 16:
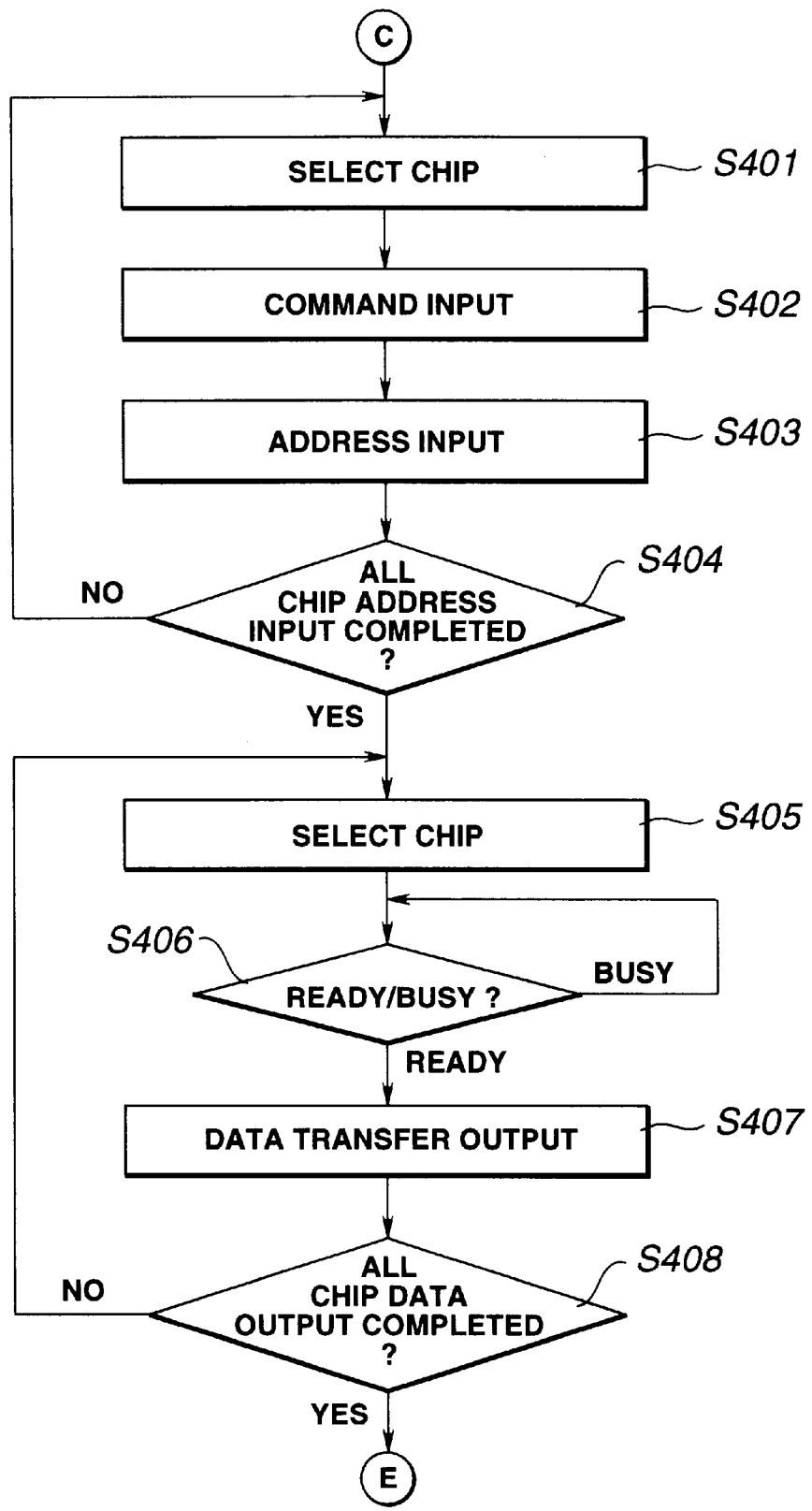
FIG. 16 is a flowchart showing the method of reading data for transfer for a recording medium controller provided in an information recording/reproducing device according to the present invention.
Figure 17:
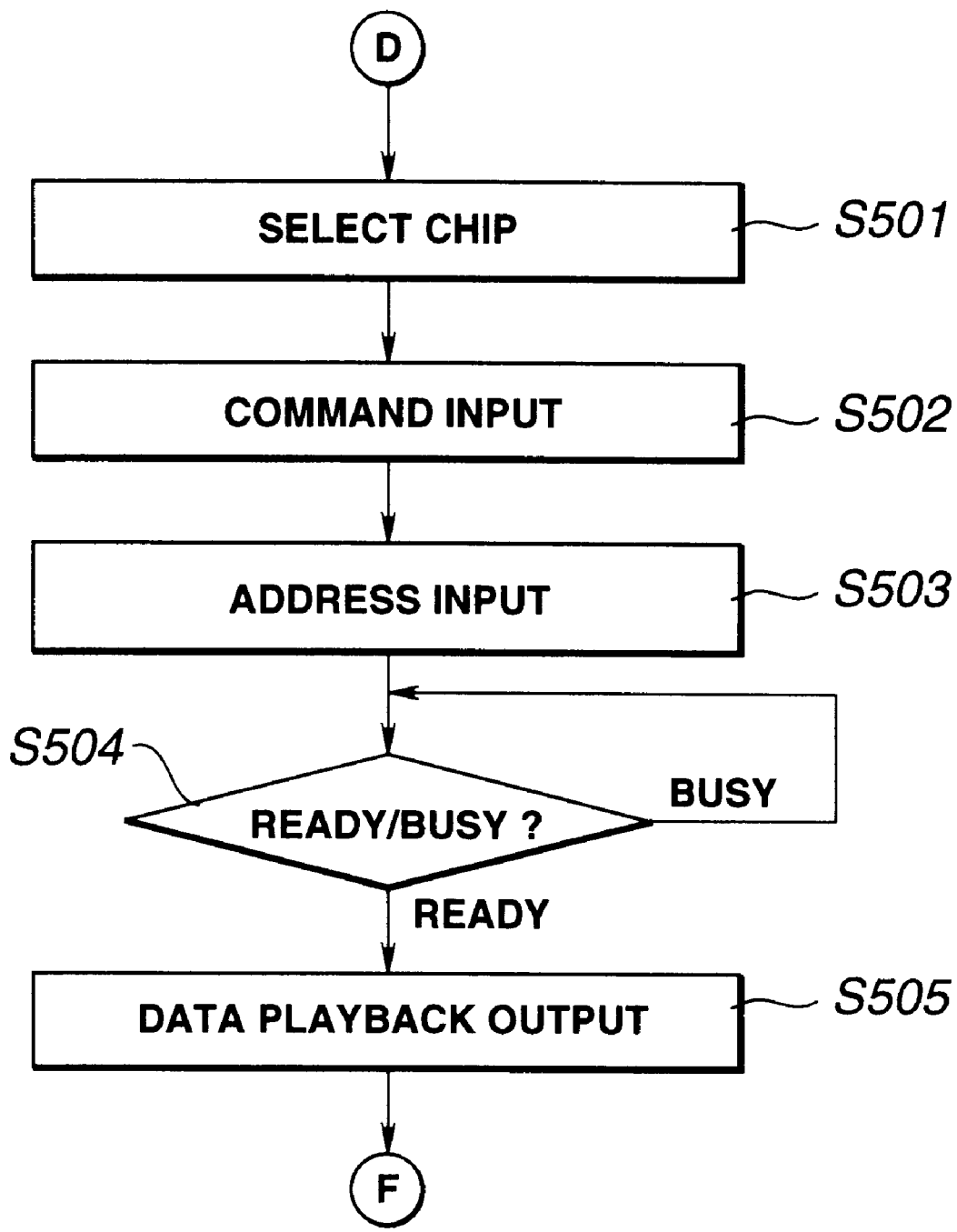
FIG. 17 is a flowchart showing the method of reading data for reproduction for a recording medium controller provided in an information recording/reproducing device according to the present invention.

FIGS. 15 to 17 show flowcharts for illustrating the data readout method by the recording medium controller 2 provided in the information recording/reproducing device according to the present invention. The file readout processing for transfer outputting differs from that for playback outputting.

First, at step S301, the recording medium controller 2 recognizes that an operation command requesting transfer outputting or playback outputting has been entered by the user at the function selection section 7. At the next step S302, the recording medium controller 2 recognizes the information concerning the file for readout which the user has entered by the function selection section 7.

At the next step S303, the recording medium controller 2 finds the management information of the designated file, such as the addresses or capacity of the recording medium 3, from the file management section 4, and executes the file readout processing at the steps following the step S303 based on the file management information.

Then, at step S304, the recording medium controller 2 branches the processing to the step S401 from C of FIG. 16, if the transfer outputting is designated by the function selection unit 7. If the playback outputting is designated by the function selection unit 7, the recording medium controller 2 branches the processing to the step S501 from D of FIG. 17.

After end of the readout operation in case the transfer outputting shown in FIG. 16 has been designated, or the readout operation in case the playback outputting shown in FIG. 17 has been designated, the recording medium controller 2 checks whether or not the readout operation for the sectors of the file has come to a close for all sectors. If the readout operation has not come to a close (NO), the recording medium controller 2 reverts to step S304 to repeat the similar processing for another memory chip. If it is found at step S305 that the readout operation has come to a close, the recording medium controller 2 terminates the file readout operation.

In case of a readout operation for transfer outputting, processing skips from step S304 shown in FIG. 15 to step S401 shown in FIG. 16.

At step S401 shown in FIG. 16, the recording medium controller 2 furnishes the chip selection signal, based on the file management information as found at step S303 in FIG. 15, to the memory chip which should now be read. For reading out the sector at the leading end of the file, the logically leading end memory chip is necessarily selected.

At the next steps S402 and S403, the recording medium controller 2 sequentially enters the page readout command and the readout address to the memory chip selected at the preceding step S401. If, at the next step S404, the recording medium controller 2 has not completed the inputting of the command and the address to all memory chips across which the file has been recorded (NO), it reverts to step S401 to repeat the above procedure until the inputting of the command and the address to all memory chips has come to a close (YES).

By repeating the processing from step S401 to step S404, sector data read out from the memory cells are held, after lapse of a pre-set internal readout time, in the internal registers of all memory chips across which the file has been recorded. Therefore, from the next step S405 on, sector data making up the file can be continuously read from the internal register. By this method, the waiting time until readout of sector data from the memory cells to the internal registers of the memory chips can be exploited effectively thus enabling readout with reduced overhead.

Then, at step S405, the recording medium controller 2 again selects the memory chip initially selected at step S401 and, at the next step S406, checks the ready/busy state as the status information of the selected memory chip. The recording medium controller 2 is in a standby state at the step S406 as long as the memory chip is in the busy state (Busy). If the recording medium controller 2 judges that the memory chip is in the ready state (ready), it reads out sector data held in the internal register of the memory chip at the next step S407 to transfer the read-out data to the transfer controller 5.

The recording medium controller 2 repeatedly executes the processing from step S405 to step S407 on all memory chips processed at steps S401 to S403 in the same sequence of the memory chips selected in the processing from the step S401 to the step S403. The recording medium controller 2 controls this processing at the next step S408.

The recording medium controller 2 at this step S408 judges whether or not transfer outputting of sector data held by the internal register of each memory chip has come to a close. If the transfer outputting has not come to a close (NO), the processing from step S405 to S407 is repeated for memory chips from which sector data has not been read out.

When transfer outputting has come to a close (YES), the recording medium controller 2 skips to step S305 beginning at E in FIG. 15.

The processing from step S405 to step S407 is repeated in the same sequence of the memory chips as that selected at step S401 for realization of high-speed transfer outputting of a large quantity of sector data making up the file.

In the case of readout for playback outputting, processing skips from step S304 of FIG. 15 to step S501 shown in FIG. 17.

At step S501, the recording medium controller 2 furnishes, based on the file management information found at step S303 shown in FIG. 15, the chip selection signal to the memory chip from which data readout is made. If the sector at the leading end of the file is read out, the logically leading end memory chip is necessarily selected.

In the next steps S502 and S503, the recording medium controller 2 sequentially enters the address for page readout command and readout to the memory chips selected at step S501. At the next step S504, the recording medium controller 2 checks the ready-busy state as the status information of the previously selected memory chip. If the memory chip is busy, the recording medium controller 2 is at a stand-by state at step S504. If the memory chip is found to be ready, the recording medium controller 2 reads out sector data held in the internal register of the memory chip and routes the read-out data to the playback controller 6.

When the data playback outputting comes to a close, the recording medium controller 2, the recording medium controller 2 skips to step S305 beginning at F in FIG. 15.

In the processing for playback outputting, as compared to the processing for transfer outputting in which command and address input and data output are executed separately, the total processing time is protracted because the processing of steps S501 to S505 is executed from one memory chip to another. However, since plural memory chips are not in operation simultaneously, power consumption can be suppressed with advantage if the speech, for example, is reproduced from prolonged time.

Of course, the processing from the steps S401 to S408 shown in FIG. 16 during transfer outputting can be applied to that during playback outputting, although not shown in FIG. 17. Similarly, the processing during playback outputting from step S501 to step S505 shown in FIG. 17 can be applied to processing during transfer outputting.

Although the processing sequence by the recording medium controller 2 shown in FIGS. 15 to 17 depends to some extent on the design parameters of the recording medium, high-speed readout is executed as a parallel operation on the chip. On the other hand, the readout operation at a low speed with reduced power consumption is executed from chip to chip, and hence can be realized irrespective of the sort of the recording medium.

Thus, the information recording/reproducing device 1 according to the present invention controls the plural memory chips by parallel operation and by sequential operation if high speed is required and if high speed is not required or low power consumption is required, respectively. This enables high speed data transfer to other devices by taking advantage of high speed operation, long-time reproduction of audio signals by exploiting low power consumption or selection of the readout depending on usage and application.

What is claimed is:

1. An information recording device comprising:
  a recording medium made up of a plurality of memory chips each having an information erasure unit larger than an information writing unit, said plurality of memory chips being in a sequenced form;
  file management means for managing file management information having a starting address expressed by an erasure unit number and a size expressed by an information writing unit number for managing a file recorded on said recording medium medium; and
  recording medium control means for writing data on said recording medium made up of the plural memory chips and erasing the data based on said file management information.

2. The information recording device as claimed in claim 1 further comprising:
  a transfer input terminal electrically connected to an information purveying device for transferring the file; and
  transfer control means for transferring the file entered from said transfer input terminal to said recording medium control means.

3. The information recording device as claimed in claim 2 wherein, if a capacity of the file entered from said transfer input terminal is larger than the continuous vacant area of the recording medium, said recording medium control means splits the file into plural portions and records the plural portions on said recording medium.

4. The information recording device as claimed in claim 3 wherein, if said file is split into the plural portions for recording, said recording medium control means records on the file management means the file management information specifying that the plural portions as written are logically continuous.

5. The information recording device as claimed in claim 1 wherein said file management information further includes information concerning a file name and a capacity, and wherein said starting address is an address of a leading memory chip of the plurality of memory chips.

6. The information recording device as claimed in claim 1 wherein said recording medium control means erases the file in parallel for said plurality of memory chips and records the file management information corresponding to such erasure in said file management means.

7. The information recording device as claimed in claim 1 wherein a flash memory is used as each of said plurality of memory chips.

8. The information recording device as claimed in claim 1 wherein a magneto-optical disc is used as said recording medium.

9. An information recording device comprising:
  a recording medium having an information erasure unit larger than an information writing unit;
  file management means for managing file management information having a starting address expressed by an erasure unit number and a size expressed by an information writing unit number for managing a file recorded on said recording medium; and
  recording medium control means for writing data on said recording medium and erasing the data based on said file management information.

10. The information recording device as claimed in claim 9 further comprising:
  a transfer input terminal electrically connected to an information purveying device for transferring the file; and transfer control means for transferring the file entered from said transfer input terminal to said recording medium control means.

11. The information recording device as claimed in claim 10 wherein, if a capacity of the file entered from said transfer input terminal is larger than a physically continuous vacant area of said recording medium, said recording medium control means splits the file into plural portions and records the plural portions on said recording medium.

12. The information recording device as claimed in claim 11 wherein, if said file is split into the plural portions for recording, said recording medium control means records on the file management means the file management information specifying that the plural portions as written are logically continuous.

13. The information recording device as claimed in claim 9 wherein said file management information further includes information concerning a file name and a capacity.

14. The information recording device as claimed in claim 9 wherein a flash memory is used as said recording medium.

15. The information recording device as claimed in claim 9 wherein a magneto-optical disc is used as said recording medium.

16. An information recording device, comprising:
a recording medium having an information erasure unit larger than an information writing unit;
a file management unit configured to manage file management information having a starting address expressed by an erasure unit number and a size expressed by an information writing unit number for managing a file recorded on said recording medium; and
a recording medium controller configured to write data on said recording medium and to erase the data based on said file management information.

17. The information recording device as claimed in claim 16 further comprising:
a transfer input terminal electrically connected to an information purveying device for transferring the file; and
a transfer controller configured to transfer the file entered from said transfer input terminal to said recording medium controller.

18. The information recording device as claimed in claim 17 wherein, if a capacity of the file entered from said transfer input terminal is larger than a physically continuous vacant area of said recording medium, said recording medium control means splits the file into plural portions and records the plural portions on said recording medium.

19. The information recording device as claimed in claim 18 wherein, if said file is split into the plural portions for recording, said recording medium controller is further configured to record on the file management means the file management information specifying that the plural portions as written are logically continuous.

20. The information recording device as claimed in claim 16 wherein said file management information further includes information concerning a file name and a capacity.

21. The information recording device as claimed in claim 16 wherein a flash memory is used as said recording medium.

22. The information recording device as claimed in claim 16 wherein a magneto-optical disc is used as said recording medium.

* * * * *